(12) United States Patent
Geselbracht et al.

(10) Patent No.: US 12,040,774 B2
(45) Date of Patent: Jul. 16, 2024

(54) SITE-SELECTIVE PIEZOELECTRIC-LAYER TRIMMING

(71) Applicant: RF360 Singapore PTE. LTD., Singapore (SG)

(72) Inventors: Philipp Geselbracht, Haar (DE); Johannes Koerber, Munich (DE); Manuel Sabbagh, Dorfen (DE); Peter Schmidt, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 404 days.

(21) Appl. No.: 17/215,901

(22) Filed: Mar. 29, 2021

(65) Prior Publication Data

US 2022/0311409 A1  Sep. 29, 2022

(51) Int. Cl.
| | | |
|---|---|---|
| H03H 9/02 | (2006.01) | |
| H03H 3/08 | (2006.01) | |
| H03H 9/145 | (2006.01) | |
| H03H 9/25 | (2006.01) | |
| H03H 9/64 | (2006.01) | |

(Continued)

(52) U.S. Cl.
CPC .......... *H03H 9/02622* (2013.01); *H03H 3/08* (2013.01); *H03H 9/02834* (2013.01); *H03H 9/02866* (2013.01); *H03H 9/145* (2013.01); *H03H 9/25* (2013.01); *H03H 9/6489* (2013.01); *H04B 1/40* (2013.01); *H10N 30/082* (2023.02)

(58) Field of Classification Search
CPC .. H03H 9/02622; H03H 3/08; H03H 9/02834; H03H 9/02866; H03H 9/145; H03H 9/25; H03H 9/6489; H03H 9/02858; H04B 1/40; H10N 30/082

USPC .......................................................... 455/73
See application file for complete search history.

(56) References Cited

U.S. PATENT DOCUMENTS

| | | | | |
|---|---|---|---|---|
| 8,816,567 | B2 * | 8/2014 | Zuo .......................... | H03H 3/02 310/365 |
| 2018/0152169 | A1 * | 5/2018 | Goto .................. | H03H 9/02574 |

(Continued)

FOREIGN PATENT DOCUMENTS

| | | |
|---|---|---|
| DE | 102009019523 A1 | 11/2010 |
| JP | 2014110457 A | 6/2014 |

(Continued)

OTHER PUBLICATIONS

International Search Report and Written Opinion—PCT/EP2022/056131—ISA/EPO—Jun. 30, 2022.

*Primary Examiner* — Eugene Yun
(74) *Attorney, Agent, or Firm* — Colby Nipper

(57) ABSTRACT

An apparatus is disclosed for site-selective piezoelectric-layer trimming. The apparatus includes at least one surface-acoustic-wave filter with an electrode structure and a piezoelectric layer. The electrode structure has multiple gaps. The piezoelectric layer has a planar surface defined by a first (X) axis and a second (Y) axis that is perpendicular to the first (X) axis. The piezoelectric layer is configured to propagate an acoustic wave along the first (X) axis. The piezoelectric layer includes a first portion that supports the electrode structure and a second portion that is exposed by the multiple gaps of the electrode structure. The second portion has different heights across the second (Y) axis. The different heights are defined with respect to a third (Z) axis that is substantially normal to the planar surface.

25 Claims, 11 Drawing Sheets

(51) Int. Cl.
*H04B 1/40* (2015.01)
*H10N 30/082* (2023.01)

(56) References Cited

U.S. PATENT DOCUMENTS

| | | |
|---|---|---|
| 2018/0212581 A1 | 7/2018 | Matsumoto |
| 2021/0021255 A1* | 1/2021 | Ballandras ......... H03H 9/02614 |
| 2021/0399717 A1* | 12/2021 | Guyette ............. H03H 9/02228 |

FOREIGN PATENT DOCUMENTS

| | | |
|---|---|---|
| WO | 2011088904 A1 | 7/2011 |
| WO | WO-2020209359 A1 | 10/2020 |
| WO | WO-2021013568 A1 | 1/2021 |

* cited by examiner

900

```
┌─────────────────────────────────────────────┐
│ Provide a surface-acoustic-wave filter       │
│ comprising an electrode structure and a      │
│ piezoelectric layer, the electrode structure │
│ having multiple gaps, the piezoelectric      │
│ layer comprising a first portion that        │
│ supports the electrode structure and a       │
│ second portion that is exposed by the        │
│ multiple gaps of the electrode structure     │
│ 902                                          │
└─────────────────────────────────────────────┘
                        │
                        ▼
┌─────────────────────────────────────────────┐
│ Mask an active track region of a             │
│ surface-acoustic-wave filter with photoresist│
│ 904                                          │
└─────────────────────────────────────────────┘
                        │
                        ▼
┌─────────────────────────────────────────────┐
│ Trim the second portion of the piezoelectric │
│ layer within a trap region of the            │
│ surface-acoustic-wave filter, the trimming   │
│ comprising reducing a first height of the    │
│ second portion of the piezoelectric layer    │
│ within the trap region relative to a second  │
│ height of the second portion of the          │
│ piezoelectric layer within the active track  │
│ region                                       │
│ 906                                          │
└─────────────────────────────────────────────┘
                        │
                        ▼
┌─────────────────────────────────────────────┐
│ Remove the photoresist from the active       │
│ track region                                 │
│ 908                                          │
└─────────────────────────────────────────────┘
```

FIG. 9

SITE-SELECTIVE PIEZOELECTRIC-LAYER TRIMMING

TECHNICAL FIELD

This disclosure relates generally to wireless transceivers and, more specifically, to a surface-acoustic-wave filter with site-selective piezoelectric-layer trimming.

BACKGROUND

Electronic devices use radio-frequency (RF) signals to communicate information. These radio-frequency signals enable users to talk with friends, download information, share pictures, remotely control household devices, and receive global positioning information. To transmit or receive the radio-frequency signals within a given frequency band, the electronic device may use filters to pass signals within the frequency band and to suppress (e.g., attenuate) jammers or noise having frequencies outside of the frequency band. It can be challenging, however, to design a filter that provides filtering for high-frequency applications, including those that utilize frequencies above 2 gigahertz (GHz), while preventing or reducing spurious modes within a passband of the filter.

SUMMARY

An apparatus is disclosed that implements site-selective piezoelectric-layer trimming Instead of increasing the mass of an electrode structure within a trap region of a surface-acoustic-wave (SAW) filter, example techniques for site-selective piezoelectric-layer trimming remove, within the trap region, a portion of the piezoelectric layer that is exposed by gaps within the electrode structure. This causes the exposed portion of the piezoelectric layer within the trap region to have a smaller height (e.g., a smaller thickness) than a portion of the piezoelectric layer that supports (or is covered by) the electrode structure. Additionally, the exposed portion of the piezoelectric layer within the trap region has a smaller height (e.g., a smaller thickness) relative to a height of the exposed portion of the electrode structure within an active track region, which was not trimmed. The trimming process can cause the exposed portion of the piezoelectric layer within the trap region to include a damage layer, which has an amorphous structure.

In an example aspect, an apparatus for filtering is disclosed. The apparatus includes at least one surface-acoustic-wave filter with an electrode structure and a piezoelectric layer. The electrode structure has multiple gaps. The piezoelectric layer has a planar surface defined by a first (X) axis and a second (Y) axis that is perpendicular to the first (X) axis. The piezoelectric layer is configured to propagate an acoustic wave along the first (X) axis. The piezoelectric layer includes a first portion that supports the electrode structure and a second portion that is exposed by the multiple gaps of the electrode structure. The second portion has different heights across the second (Y) axis. The different heights are defined with respect to a third (Z) axis that is substantially normal to the planar surface.

In an example aspect, an apparatus for filtering is disclosed. The apparatus includes at least one surface-acoustic-wave filter configured to generate a filtered signal from a radio-frequency signal. The surface-acoustic-wave filter includes electrode means for converting the radio-frequency signal into an acoustic wave and converting a propagated acoustic wave into the filtered signal. The electrode means has multiple gaps. The surface-acoustic-wave filter also includes means for propagating the acoustic wave to produce the propagated acoustic wave along a first (X) axis. The means for propagating the acoustic wave has a planar surface defined by the first (X) axis and a second (Y) axis that is perpendicular to the first (X) axis. The means for propagating the acoustic wave includes a first portion that supports the electrode means. The piezoelectric means also includes a second portion that is exposed by the multiple gaps of the electrode means. The second portion has different heights across the second (Y) axis. The different heights are defined with respect to a third (Z) axis that is normal to the planar surface.

In an example aspect, a method of manufacturing a surface-acoustic-wave filter is disclosed. The method includes providing a surface-acoustic-wave filter. The surface-acoustic-wave filter includes an electrode structure having multiple gaps and a piezoelectric layer. Th piezoelectric layer includes a first portion that supports the electrode structure and a second portion that is exposed by the multiple gaps of the electrode structure. The method also includes masking an active track region of the surface-acoustic-wave filter with photoresist. The method additionally includes trimming the second portion of the piezoelectric layer within a trap region of the surface-acoustic-wave filter. The trimming includes reducing a first height of the second portion of the piezoelectric layer within the trap region relative to a second height of the second portion of the piezoelectric layer within the active track region. The method further includes removing the photoresist from the active track region.

In an example aspect, a surface-acoustic-wave filter is disclosed. The surface-acoustic-wave filter includes an electrode structure, a piezoelectric layer, and a damage layer. The electrode structure and the piezoelectric layer are disposed within a first region and a second region. The electrode structure has multiple gaps. The first region extends across a first (X) axis and includes a first section along a second (Y) axis. The second (Y) axis is perpendicular to the first (X) axis. The second region extends across the first (X) axis and includes a second section along the second (Y) axis. The piezoelectric layer has a planar surface defined by the first (X) axis and the second (Y) axis. The piezoelectric layer includes a first portion that supports the electrode structure and a second portion that is exposed by the multiple gaps of the electrode structure. The second portion of the piezoelectric layer includes a crystalline structure. The damage layer is disposed across a surface of the second portion of the piezoelectric layer within the second region. The damage layer includes an amorphous structure that differs from the crystalline structure.

BRIEF DESCRIPTION OF DRAWINGS

FIG. 3-1 illustrates an example implementation of a surface-acoustic-wave filter with site-selective piezoelectric-layer trimming.

FIG. 3-2 illustrates an example implementation of a high-quality temperature-compensated surface-acoustic-wave filter with site-selective piezoelectric-layer trimming.

FIG. 6-1 illustrates example height variations within a piezoelectric layer across a trap region of a surface-acoustic-wave filter with site-selective piezoelectric-layer trimming.

FIG. 6-2 illustrates example height variations within a piezoelectric layer across multiple regions of a surface-acoustic-wave filter with site-selective piezoelectric-layer trimming.

FIG. 9 is a flow diagram illustrating an example process for manufacturing a surface-acoustic-wave filter using site-selective piezoelectric-layer trimming.

DETAILED DESCRIPTION

Figure 1:
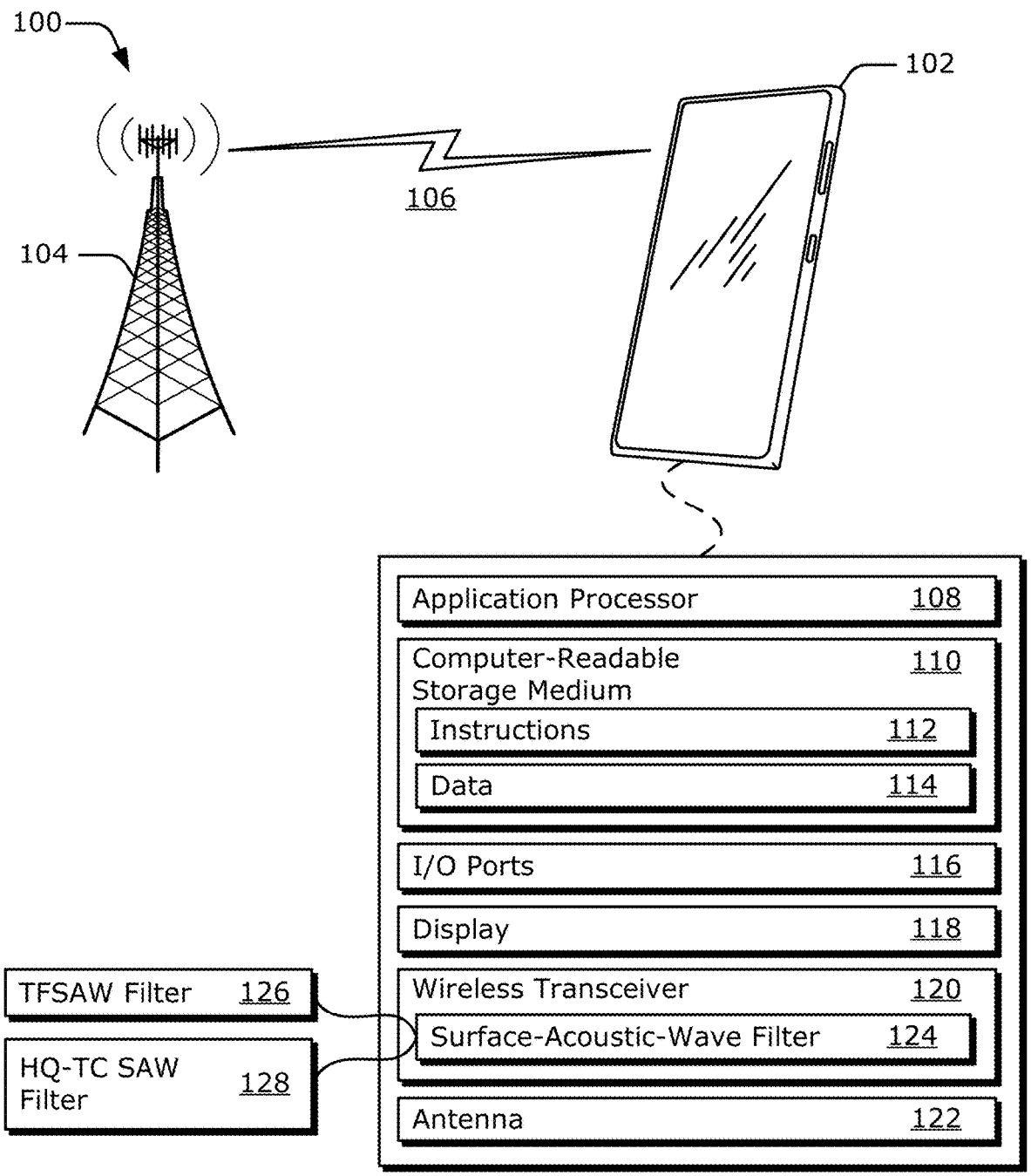
FIG. 1 illustrates an example operating environment for an acoustic filter with a site-selective piezoelectric-layer trimming.

To transmit or receive radio-frequency signals within a given frequency band, an electronic device may use filters to pass signals within the frequency band and to suppress (e.g., attenuate) jammers or noise having frequencies outside of the frequency band. Electroacoustic devices (e.g., "acoustic filters") can be used to filter high-frequency signals in many applications, such as those with frequencies that are greater than 100 megahertz (MHz). An acoustic filter is tuned to pass certain frequencies (e.g., frequencies within its passband) and attenuate other frequencies (e.g., frequencies that are outside of its passband). Using a piezoelectric material as a vibrating medium, the acoustic filter operates by transforming an electrical signal wave that is propagating along an electrical conductor into an acoustic wave (e.g., an acoustic signal wave) that forms across the piezoelectric material. The acoustic wave is then converted back into an electrical filtered signal. The acoustic filter can include an electrode structure that transforms or converts between the electrical and acoustic waves.

The acoustic wave propagates across the piezoelectric material at a velocity having a magnitude that is significantly less than that of the propagation velocity of the electrical wave. Generally, the magnitude of the propagation velocity of a wave is proportional to a size of a wavelength of the wave. Consequently, after conversion of the electrical signal wave into the acoustic wave, the wavelength of the acoustic wave is significantly smaller than the wavelength of the electrical signal wave. The resulting smaller wavelength of the acoustic wave enables filtering to be performed using a smaller filter device. This permits acoustic filters to be used in space-constrained devices, including portable electronic devices such as cellular phones.

It can be challenging, however, to design an acoustic filter that can provide filtering for high-frequency applications, including those that utilize frequencies above 2 gigahertz (GHz), while maintaining or reducing spurious modes (e.g., spurious wave modes) below certain levels within a passband. A spurious mode is an undesired mode, which can degrade performance of the acoustic filter. Some filter designs customize a geometry of the electrode structure of the acoustic filter to attenuate spurious modes. As an example, fingers within the electrode structure can have varying widths or heights across the length of the fingers. In particular, a finger can have a wider and/or taller profile (e.g., include a hammerhead and dot, respectively) within a trap region of the acoustic filter compared to an active track region of the acoustic filter. Within the trap region and the active track region, portions of adjacent fingers of the acoustic filter overlap. The trap region borders the active track region and can include ends of the fingers. The addition of hammerheads and dots to the fingers increase the mass of the electrode structure within the trap region relative to the active track region. Customizing the electrode structure in this way can attenuate (e.g., suppress) a spurious mode.

Although this technique enables suppression of a spurious mode, it can be challenging to apply this technique to acoustic filters that support higher frequencies, such as those used in frequency bands 7, 40, N77, and N79; with Wi-Fi® at 2.4 GHz; with 5 GHz frequencies; and/or at sub-6 GHz frequencies. In particular, a size of the hammerhead or dot within the trap region can become too small or potentially less practical/costly for the manufacturing equipment in some scenarios to accurately produce due to lithographic constraints.

To address this challenge, example techniques for implementing a surface-acoustic-wave filter with site-selective piezoelectric-layer trimming are described. Instead of increasing the mass of an electrode structure within a trap region of the surface-acoustic-wave filter, the example techniques for site-selective piezoelectric-layer trimming remove, within the trap region, a portion of the piezoelectric layer that is exposed by gaps within the electrode structure. This causes the exposed portion of the piezoelectric layer within the trap region to have a smaller height (e.g., a smaller thickness) than a portion of the piezoelectric layer that supports (or is covered by) the electrode structure. Additionally, the exposed portion of the piezoelectric layer within the trap region has a smaller height (e.g., a smaller thickness) relative to a height of the exposed portion of the electrode structure within an active track region. The trimming process can cause the exposed portion of the piezoelectric layer within the trap region to include a damage layer, which has an amorphous structure. In some implementations, the mass of the electrode structure can also be decreased within the trap region, such as by removing material from the surface of the fingers and/or rounding surface edges of the fingers.

There are several benefits that result from using site-selective piezoelectric-layer trimming. These benefits include both operational improvements and manufacturing advantages. One operational benefit is the suppression of spurious modes. By tailoring the geometry of the exposed portion of the piezoelectric layer within the trap region, the site-selective piezoelectric-layer trimming causes an acoustic wave to have a lower velocity within the trap region in comparison to the active track region. The lower velocity within the trap region suppresses spurious modes, such as a transversal mode. Another operational benefit involves the reduction in a magnitude of an electric field within the trap region, which further improves power durability. From a manufacturing perspective, the techniques for site-selective piezoelectric-layer trimming can be potentially easier to implement compared to the techniques for applying hammerheads or dots, especially for high-frequency applications.

FIG. 1 illustrates an example environment 100 for site-selective piezoelectric-layer trimming In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular; IEEE 802.11 (e.g., Wi-Fi®); IEEE 802.15 (e.g., Bluetooth®); IEEE 802.16 (e.g., WiMAX®); and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 122.

In the example shown in FIG. 1, the wireless transceiver 120 includes at least one surface-acoustic-wave filter 124. In some implementations, the wireless transceiver 120 includes multiple surface-acoustic-wave filters 124, which can be arranged in series, in parallel, in a ladder structure, in a lattice structure, or some combination thereof. The surface-acoustic-wave filter 124 can be a thin-film surface-acoustic-wave filter 126 (TFSAW filter 126) or a high-quality temperature-compensated surface-acoustic-wave filter 128 (HQ-TC SAW filter 128). The surface-acoustic-wave filter 124 can be manufactured using site-selective piezoelectric-layer trimming to suppress spurious modes. The surface-acoustic-wave filter 124 is further described with respect to FIG. 2.

Figure 2:
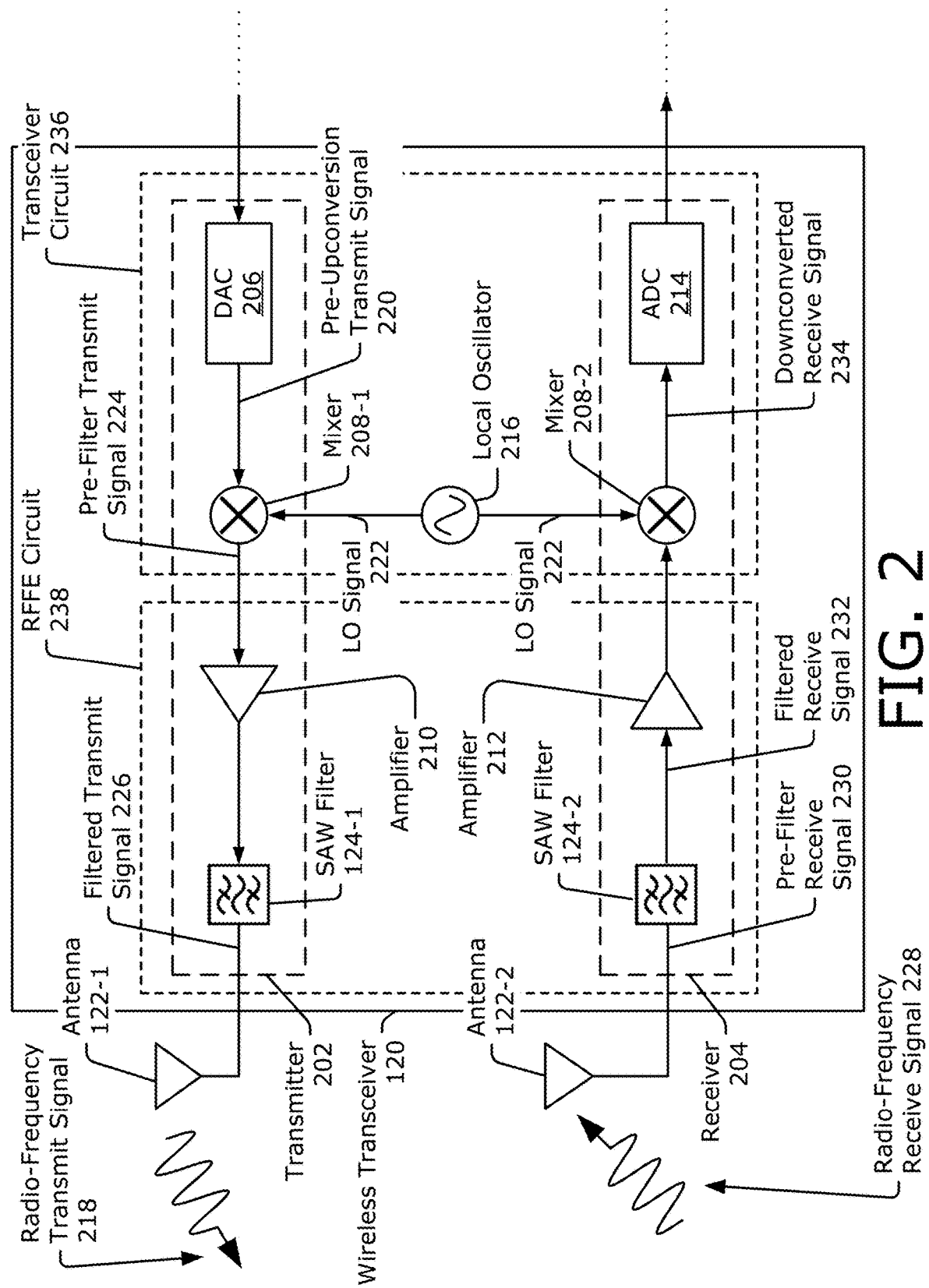
FIG. 2 illustrates an example wireless transceiver including surface-acoustic-wave filters with site-elective piezoelectric-layer trimming.

FIG. 2 illustrates an example wireless transceiver 120. In the depicted configuration, the wireless transceiver 120 includes a transmitter 202 and a receiver 204, which are respectively coupled to a first antenna 122-1 and a second antenna 122-2. In other implementations, the transmitter 202 and the receiver 204 can be connected to a same antenna through a duplexer (not shown), such as a transmit-receive switch or a circulator. The transmitter 202 is shown to include at least one digital-to-analog converter 206 (DAC 206), at least one first mixer 208-1, at least one amplifier 210 (e.g., a power amplifier), and at least one first surface-acoustic-wave filter 124-1. The receiver 204 includes at least one second surface-acoustic-wave filter 124-2, at least one amplifier 212 (e.g., a low-noise amplifier), at least one second mixer 208-2, and at least one analog-to-digital converter 214 (ADC 214). The first mixer 208-1 and the second mixer 208-2 are coupled to a local oscillator 216. Although not explicitly shown, the digital-to-analog converter 206 of the transmitter 202 and the analog-to-digital converter 214 of the receiver 204 can be coupled to the application processor 108 (of FIG. 1) or another processor associated with the wireless transceiver 120 (e.g., a modem).

In some implementations, the wireless transceiver 120 is implemented using multiple circuits, such as a transceiver circuit 236 and a radio-frequency front-end (RFFE) circuit 238. As such, the components that form the transmitter 202 and the receiver 204 are distributed across these circuits. As shown in FIG. 2, the transceiver circuit 236 includes the digital-to-analog converter 206 of the transmitter 202, the mixer 208-1 of the transmitter 202, the mixer 208-2 of the receiver 204, and the analog-to-digital converter 214 of the receiver 204. In other implementations, the digital-to-analog converter 206 and the analog-to-digital converter 214 can be implemented on another separate circuit that includes the application processor 108 or the modem. The radio-frequency front-end circuit 238 includes the amplifier 210 of the transmitter 202, the surface-acoustic-wave filter 124-1 of the transmitter 202, the surface-acoustic-wave filter 124-2 of the receiver 204, and the amplifier 212 of the receiver 204.

During transmission, the transmitter 202 generates a radio-frequency transmit signal 218, which is transmitted using the antenna 122-1. To generate the radio-frequency transmit signal 218, the digital-to-analog converter 206 provides a pre-upconversion transmit signal 220 to the first mixer 208-1. The pre-upconversion transmit signal 220 can be a baseband signal or an intermediate-frequency signal. The first mixer 208-1 upconverts the pre-upconversion transmit signal 220 using a local oscillator (LO) signal 222 provided by the local oscillator 216. The first mixer 208-1 generates an upconverted signal, which is referred to as a pre-filter transmit signal 224. The pre-filter transmit signal 224 can be a radio-frequency signal and include some spurious (e.g., unwanted) frequencies, such as a harmonic frequency. The amplifier 210 amplifies the pre-filter transmit signal 224 and passes the amplified pre-filter transmit signal 224 to the first surface-acoustic-wave filter 124-1.

The first surface-acoustic-wave filter 124-1 filters the amplified pre-filter transmit signal 224 to generate a filtered transmit signal 226. As part of the filtering process, the first surface-acoustic-wave filter 124-1 attenuates the one or more spurious frequencies within the pre-filter transmit signal 224. The transmitter 202 provides the filtered transmit signal 226 to the antenna 122-1 for transmission. The transmitted filtered transmit signal 226 is represented by the radio-frequency transmit signal 218.

During reception, the antenna 122-2 receives a radio-frequency receive signal 228 and passes the radio-frequency receive signal 228 to the receiver 204. The second surface-acoustic-wave filter 124-2 accepts the received radio-frequency receive signal 228, which is represented by a pre-filter receive signal 230. The second surface-acoustic-wave filter 124-2 filters any spurious frequencies within the pre-filter receive signal 230 to generate a filtered receive signal 232. Example spurious frequencies can include jammers or noise from the external environment.

The amplifier 212 of the receiver 204 amplifies the filtered receive signal 232 and passes the amplified filtered receive signal 232 to the second mixer 208-2. The second mixer 208-2 downconverts the amplified filtered receive signal 232 using the local oscillator signal 222 to generate the downconverted receive signal 234. The analog-to-digital converter 214 converts the downconverted receive signal 234 into a digital signal, which can be processed by the application processor 108 or another processor associated with the wireless transceiver 120 (e.g., the modem).

FIG. 2 illustrates one example configuration of the wireless transceiver 120. Other configurations of the wireless transceiver 120 can support multiple frequency bands and share an antenna 122 across multiple transceivers. One of ordinary skill in the art can appreciate the variety of other configurations for which surface-acoustic-wave filters 124 may be included. For example, the surface-acoustic-wave filters 124 can be integrated within duplexers or diplexers of the wireless transceiver 120. Example implementations of the surface-acoustic-wave filter 124-1 or 124-2 are further described with respect to FIGS. 3-1 and 3-2.

Figure 3:
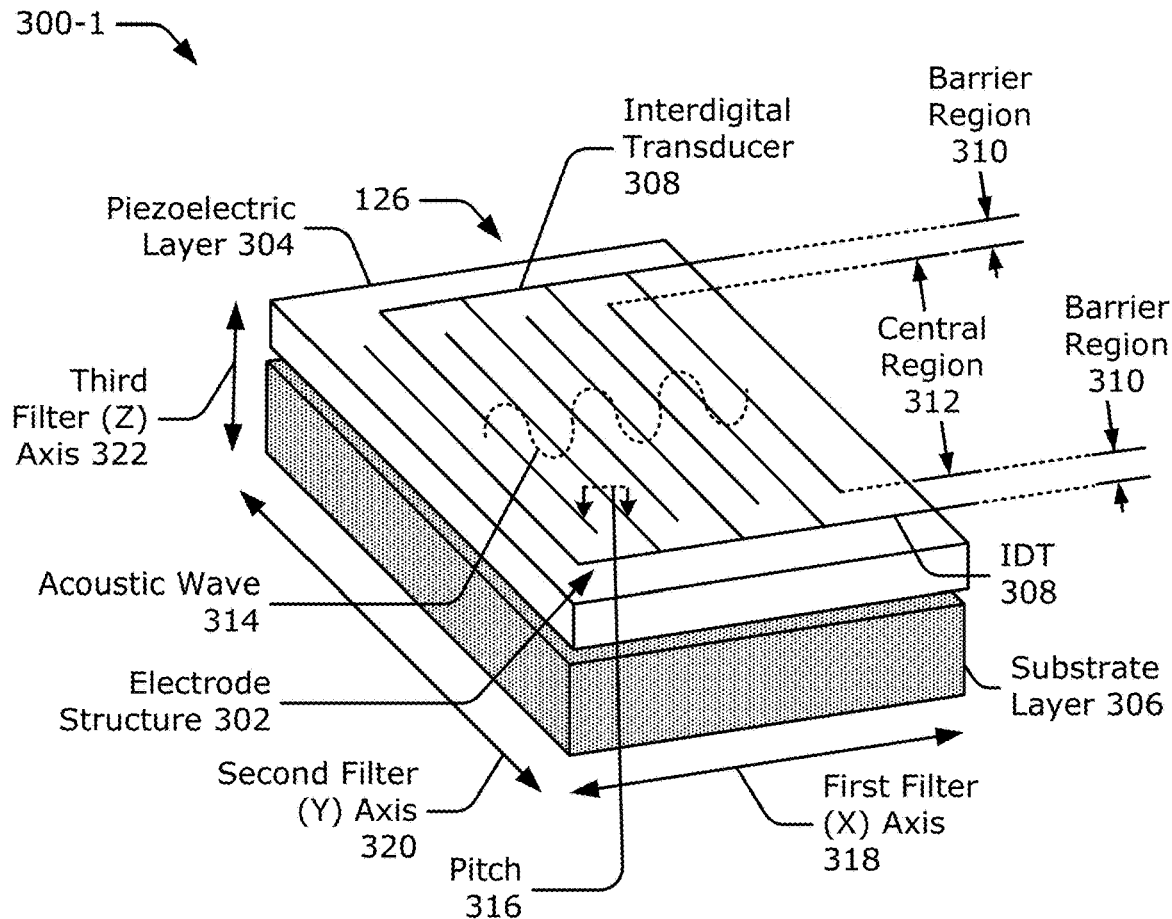
Figure 1:
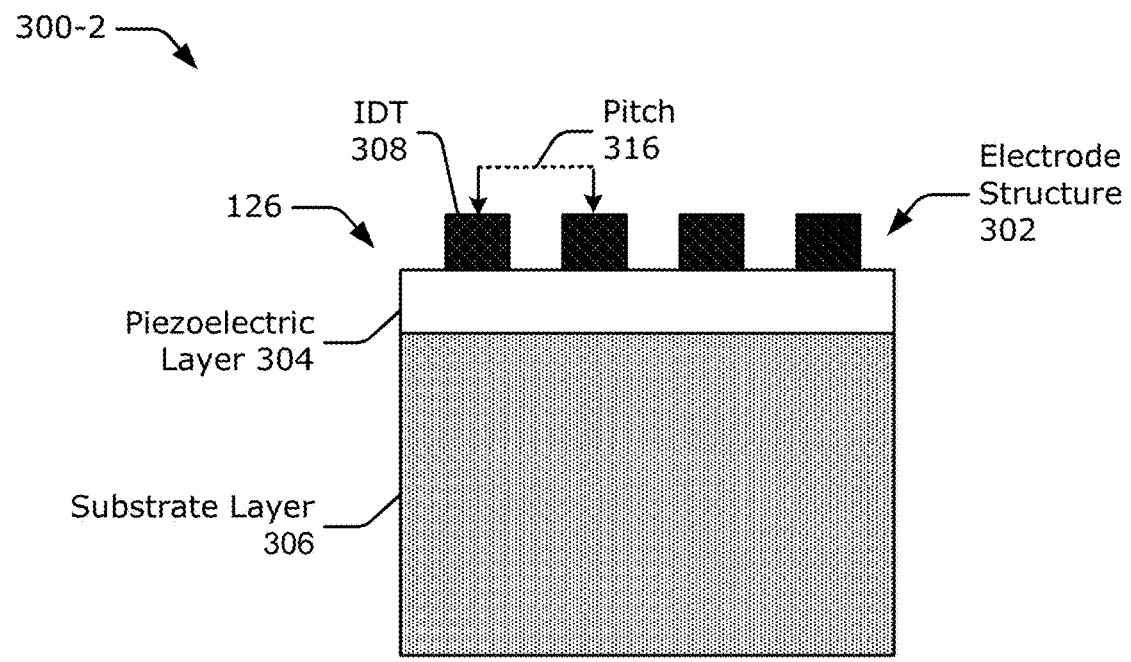
Figure 3:
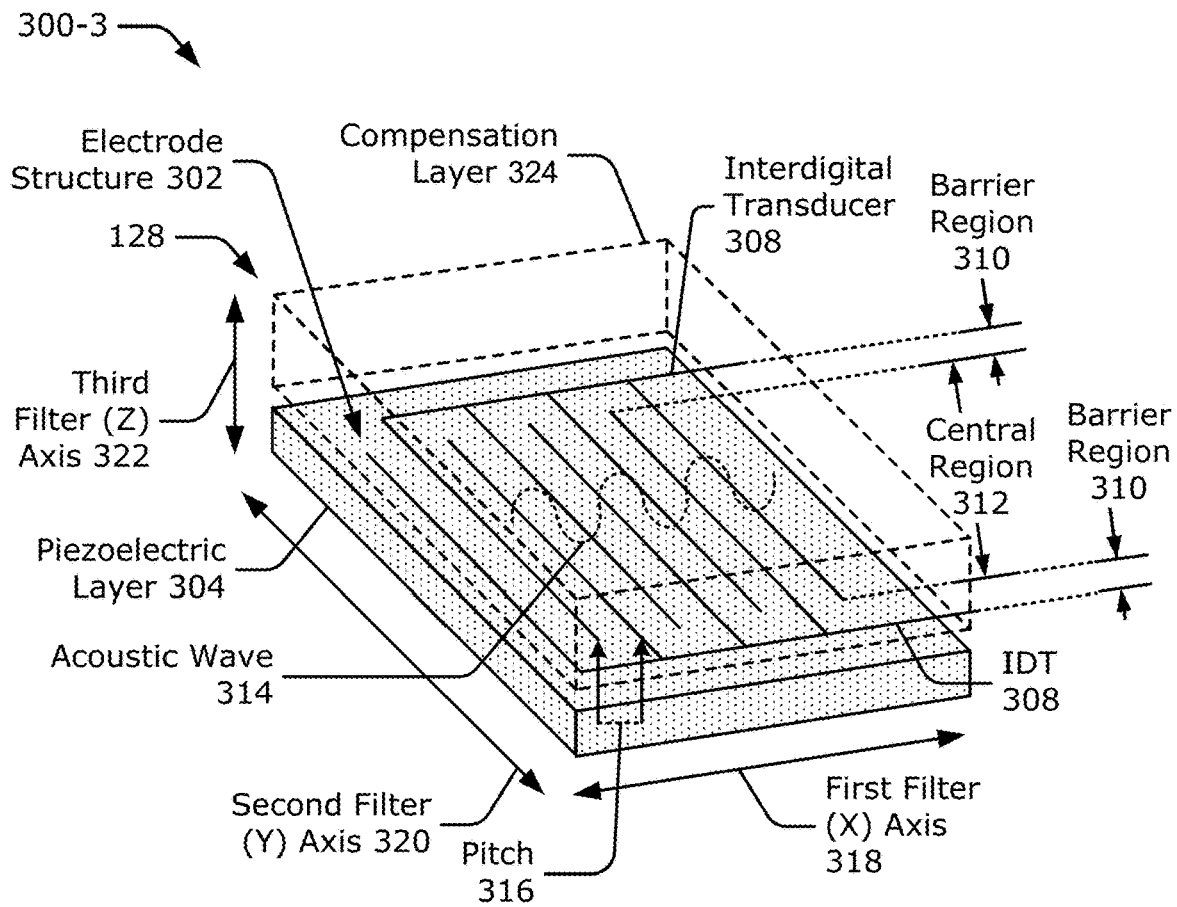
Figure 2:
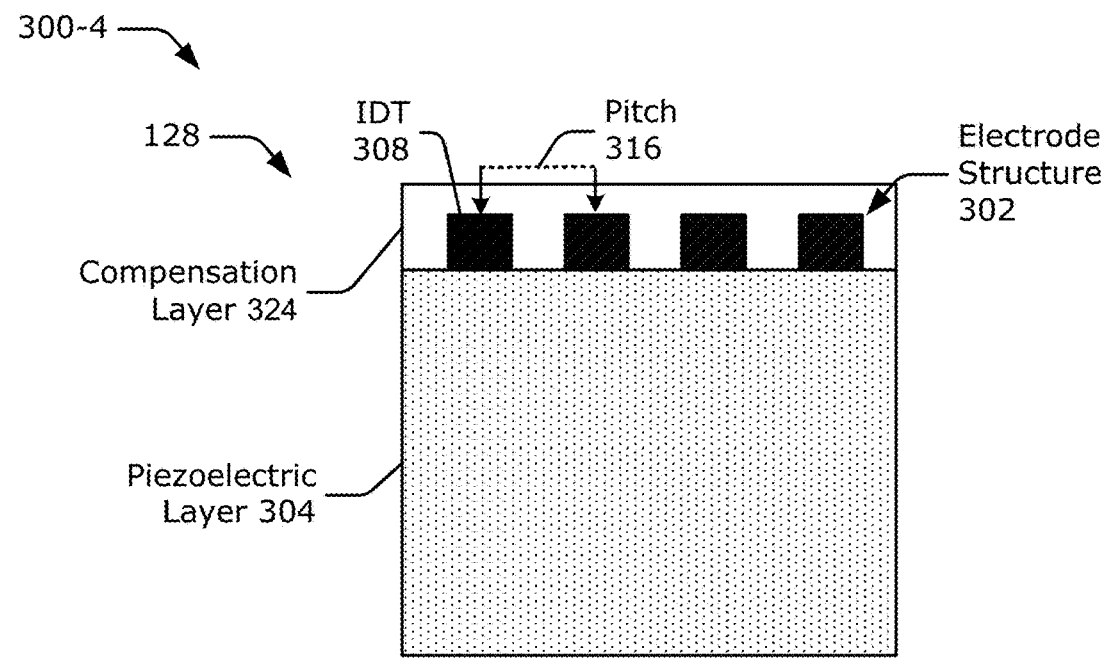

FIG. 3-1 illustrates an example implementation of the thin-film surface-acoustic-wave filter 126 with site-selective piezoelectric-layer trimming A three-dimensional perspective view 300-1 of the thin-film surface-acoustic-wave filter 126 is shown at the top of FIG. 3-1, and a two-dimensional cross-section view 300-2 of the thin-film surface-acoustic-wave filter 126 is shown at the bottom of FIG. 3-1.

The thin-film surface-acoustic-wave filter 126 includes at least one electrode structure 302, at least one piezoelectric layer 304 (e.g., piezoelectric material), and at least one substrate layer 306. The electrode structure 302 is implemented using conductive material, such as metal, and can include one or more layers. The one or more layers can include one or more metal layers and can optionally include one or more adhesion layers. As an example, the metal layers can be composed of aluminium (Al), copper (Cu), silver (Ag), gold (Au), tungsten (W), or some combination or doped version thereof. The adhesion layers can be composed of chromium (Cr), titanium (Ti), molybdenum (Mo), or some combination thereof.

The electrode structure 302 can include one or more interdigital transducers 308. The interdigital transducer 308 converts an electrical signal into an acoustic wave and converts the acoustic wave into a filtered electrical signal. Although not explicitly shown, the electrode structure 302 can also include two or more reflectors. In an example implementation, the interdigital transducer 308 is arranged between two reflectors (not shown), which reflect the acoustic wave back towards the interdigital transducer 308.

In the depicted configuration shown in the two-dimensional cross-section view 300-2, the piezoelectric layer 304 is disposed between the electrode structure 302 and the substrate layer 306. The piezoelectric layer 304 can be implemented using a variety of different materials that exhibit piezoelectric properties (e.g., can transfer mechanical energy into electrical energy or electrical energy into mechanical energy). Example types of material include lithium niobate ($LiNbO_3$), lithium tantalate ($LiTaO_3$), or quartz. In general, the material that forms the piezoelectric layer 304 has a crystalline structure. This crystalline structure is defined by an ordered arrangement of particles (e.g., atoms, ions, or molecules).

The substrate layer 306 includes one or more sublayers that can support passivation, temperature compensation, power handling, mode suppression, and so forth. As an example, the substrate layer 306 can include at least one compensation layer, at least one charge-trapping layer, at least one support layer, or some combination thereof. These sublayers can be considered part of the substrate layer 306 or their own separate layers. Example types of material that can form one or more sublayers within the substrate layer 306 include silicon dioxide ($SiO_2$), polysilicon (poly-Si) (e.g., polycrystalline silicon or multicrystalline silicon), amorphous silicon, silicon nitride (SiN), silicon oxynitride (SiON), aluminium nitride (AlN), non-conducting material (e.g., silicon (Si), doped silicon, sapphire, silicon carbide (SiC), fused silica, glass, diamond), or some combination thereof.

In the three-dimensional perspective view 300-1, the interdigital transducer 308 is shown to have two comb-shaped electrode structures with fingers (e.g., electrode fingers) extending from two busbars (e.g., conductive segments or rails) towards each other. The fingers are arranged in an interlocking manner in between the two busbars of the interdigital transducer 308 (e.g., arranged in an interdigitated manner). In other words, the fingers connected to a first busbar extend towards a second busbar but do not connect to the second busbar. As such, there is a barrier region 310 between the ends of these fingers and the second busbar. Likewise, fingers connected to the second busbar extend towards the first busbar but do not connect to the first busbar. There is therefore a barrier region 310 between the ends of these fingers and the first busbar, as further described with respect to FIG. 4.

In the direction along the busbars, there is an overlap region including a central region 312 where a portion of one finger overlaps with a portion of an adjacent finger. This central region 312, including the overlap, may be referred to as the aperture, track, or active region where electric fields are produced between fingers to cause an acoustic wave 314 to form at least in this region of the piezoelectric layer 304.

A physical periodicity of the fingers is referred to as a pitch 316 of the interdigital transducer 308. The pitch 316 may be indicated in various ways. For example, in certain aspects, the pitch 316 may correspond to a magnitude of a distance between consecutive fingers of the interdigital transducer 308 in the central region 312. This distance may be defined, for example, as the distance between center points of each of the fingers. The distance may be generally measured between a right (or left) edge of one finger and the right (or left) edge of an adjacent finger when the fingers have uniform widths. In certain aspects, an average of distances between adjacent fingers of the interdigital transducer 308 may be used for the pitch 316. The frequency at which the piezoelectric layer 304 vibrates is a main-resonance frequency of the electrode structure 302. The frequency is determined at least in part by the pitch 316 of the interdigital transducer 308 and other properties of the thin-film surface-acoustic-wave filter 126.

It should be appreciated that while a certain number of fingers are illustrated in FIG. 3, the number of actual fingers and lengths and width of the fingers and busbars may be different in an actual implementation. Such parameters depend on the particular application and desired filter characteristics. In addition, the thin-film surface-acoustic-wave filter 126 can include multiple interconnected electrode structures each including multiple interdigital transducers 308 to achieve a desired passband (e.g., multiple interconnected resonators or interdigital transducers 308 in series or parallel connections to form a desired filter transfer function).

Although not shown, each reflector within the electrode structure 302 can have two busbars and a grating structure of conductive fingers that each connect to both busbars. In some implementations, the pitch of the reflector can be similar to or the same as the pitch 316 of the interdigital transducer 308 to reflect the acoustic wave 314 in the resonant frequency range.

In the three-dimensional perspective view 300-1, the thin-film surface-acoustic-wave filter 126 is defined by a first (X) axis 318, a second (Y) axis 320, and a third (Z) axis 322. The first axis 318 and the second axis 320 are parallel to a planar surface of the piezoelectric layer 304, and the second axis 320 is perpendicular to the first axis 318. The third axis 322 is normal (e.g., perpendicular) to the planar surface of the piezoelectric layer 304. The busbars of the interdigital transducer 308 are oriented to be parallel to the first axis 318. The fingers of the interdigital transducer 308 are orientated to be parallel to the second axis 320. Also, an orientation of the piezoelectric layer 304 causes an acoustic wave 314 to mainly form in a direction of the first axis 318. As such, the acoustic wave 314 forms in a direction that is substantially perpendicular to the direction of the fingers of the interdigital transducer 308. Another example type of surface-acoustic-wave filter 124 is further described with respect to FIG. 3-2.

FIG. 3-2 illustrates an example implementation of the high-quality temperature-compensated surface-acoustic-wave filter 128 with site-selective piezoelectric-layer trimming A three-dimensional perspective view 300-3 of the high-quality temperature-compensated surface-acoustic-wave filter 128 is shown at the top of FIG. 3-2, and a two-dimensional cross-section view 300-4 of the high-quality temperature-compensated surface-acoustic-wave filter 128 is shown at the bottom of FIG. 3-2.

The high-quality temperature-compensated surface-acoustic-wave filter 128 includes at least one electrode structure 302, at least one piezoelectric layer 304, and at least one compensation layer 324. The compensation layer 324 can provide temperature compensation to enable the high-quality temperature-compensated surface-acoustic-wave filter 128 to achieve a target temperature coefficient of frequency. In example implementations, the compensation layer 324 can be implemented using at least one silicon dioxide layer.

In the depicted configuration shown in the two-dimensional cross-section view 300-4, the electrode structure 302 is disposed between the piezoelectric layer 304 and the compensation layer 324. The piezoelectric layer 304 can form a substrate of the high-quality temperature-compensated surface-acoustic-wave filter 128.

The electrode structure 302 of the high-quality temperature-compensated surface-acoustic-wave filter 128 can be similar to the electrode structure 302 described above with respect to the thin-film surface-acoustic-wave filter 126 of FIG. 3-1. Likewise, the piezoelectric layer 304 of the high-quality temperature-compensated surface-acoustic-wave filter 128 can be similar to the piezoelectric layer 304 described above with respect to the thin-film surface-acoustic-wave filter 126 of FIG. 3-1. The piezoelectric layer 304 of the high-quality temperature-compensated surface-acoustic-wave filter 128, however, can be thicker than the piezoelectric layer 304 of the thin-film surface-acoustic-wave filter 126 of FIG. 3-1.

In the three-dimensional perspective view 300-1, the high-quality temperature-compensated surface-acoustic-wave filter 128 is defined by the first (X) axis 318, the second (Y) axis 320, and the third (Z) axis 322. The first axis 318 and the second axis 320 are parallel to a planar surface of the piezoelectric layer 304, and the second axis 320 is perpendicular to the first axis 318. The third axis 322 is normal (e.g., perpendicular) to the planar surface of the piezoelectric layer 304. The busbars of the interdigital transducer 308 are oriented to be parallel to the first axis 318. The fingers of the interdigital transducer 308 are orientated to be parallel to the second axis 320. Also, an orientation of the piezoelectric layer 304 causes an acoustic wave 314 to mainly form in a direction of the first axis 318. As such, the acoustic wave 314 forms in a direction that is substantially perpendicular to the direction of the fingers of the interdigital transducer 308.

Similar to the thin-film surface-acoustic-wave filter 126 of FIG. 3-1, the high-quality temperature-compensated surface-acoustic-wave filter 128 of FIG. 3-2 can also include the barrier region 310 and the central region 312. The thin-film surface-acoustic-wave filter 126 of FIG. 3-1 and the high-quality temperature-compensated surface-acoustic-wave filter 128 of FIG. 3-2 can have similar operations, which are generally described below with respect to the surface-acoustic-wave filter 124.

During operation, the surface-acoustic-wave filter 124 (e.g., the thin-film surface-acoustic-wave filter 126 of FIG. 3-1 or the high-quality temperature-compensated surface-acoustic-wave filter 128 of FIG. 3-2) accepts a radio-frequency signal, such as the pre-filter transmit signal 224 or the pre-filter receive signal 230 shown in FIG. 2. The electrode structure 302 excites an acoustic wave 314 on the piezoelectric layer 304 using the inverse piezoelectric effect. For example, the interdigital transducer 308 in the electrode structure 302 generates an alternating electric field based on the accepted radio-frequency signal. The piezoelectric layer 304 enables the acoustic wave 314 to be formed in response to the alternating electric field generated by the interdigital transducer 308. In other words, the piezoelectric layer 304 causes, at least partially, the acoustic wave 314 to form responsive to electrical stimulation by one or more interdigital transducers 308.

The acoustic wave 314 propagates across the piezoelectric layer 304 and interacts with the interdigital transducer 308 or another interdigital transducer within the electrode structure 302 (not shown in FIG. 3-1 or 3-2). The acoustic wave 314 that propagates can be a standing wave. In some implementations, two reflectors within the electrode structure 302 cause the acoustic wave 314 to be formed as a standing wave across a portion of the piezoelectric layer 304. In other implementations, the acoustic wave 314 propagates across the piezoelectric layer 304 from the interdigital transducer 308 to another interdigital transducer (not shown).

Using the piezoelectric effect, the electrode structure 302 generates a filtered radio-frequency signal based on the propagated surface acoustic wave 314. In particular, the piezoelectric layer 304 generates an alternating electric field due to the mechanical stress generated by the propagation of the acoustic wave 314. The alternating electric field induces an alternating current in the other interdigital transducer or the interdigital transducer 308. This alternating current forms the filtered radio-frequency signal, which is provided at an output of the surface-acoustic-wave filter 124. The filtered radio-frequency signal can include the filtered transmit signal 226 or the filtered receive signal 232 of FIG. 2.

Figure 4:
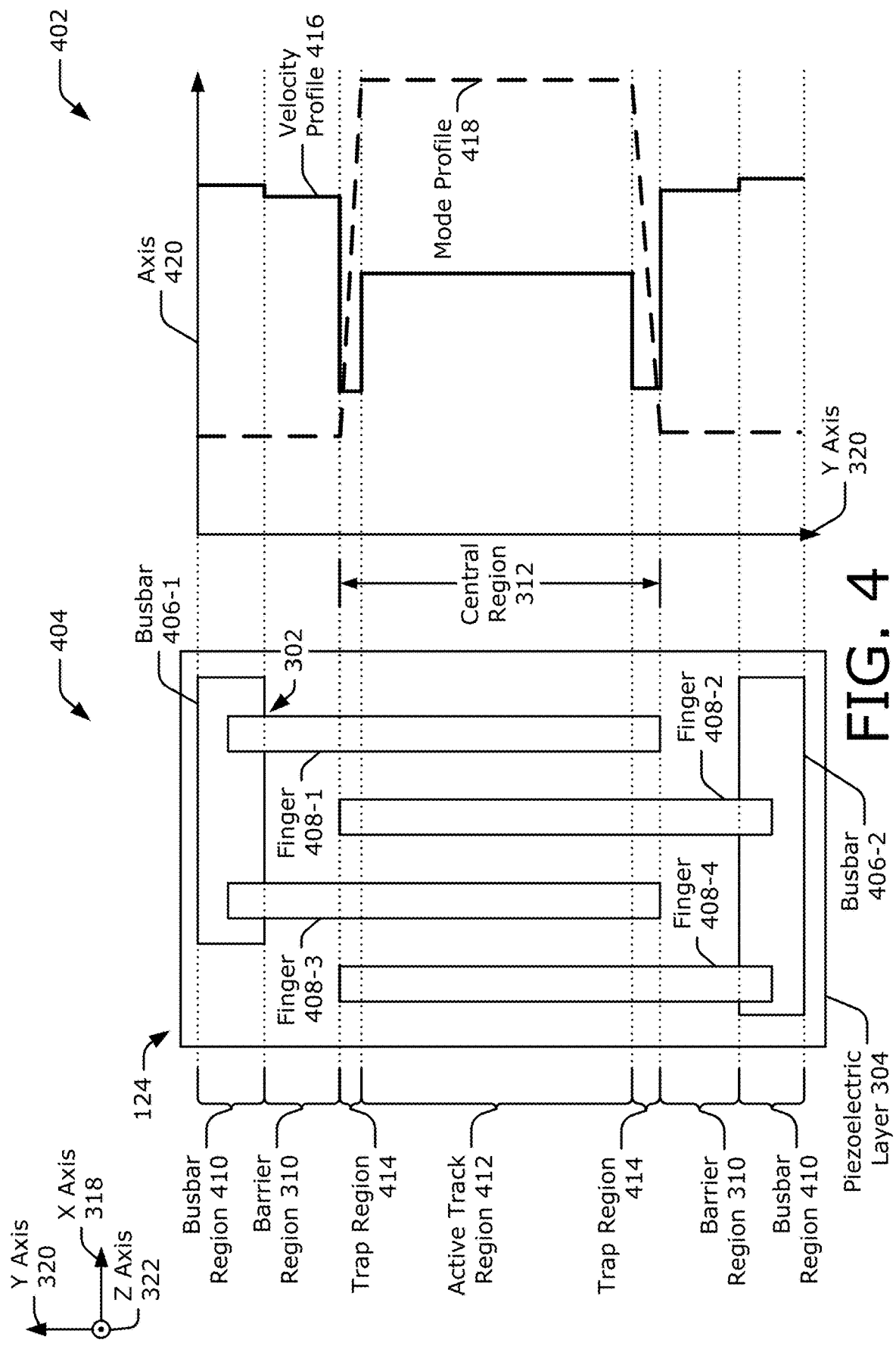
FIG. 4 illustrates an example graph depicting velocity and mode profiles associated with regions of a surface-acoustic-wave filter with site-selective piezoelectric-layer trimming.

FIG. 4 illustrates an example graph 402 depicting velocity and mode profiles associated with regions of the surface-acoustic-wave filter 124 with site-selective piezoelectric-layer trimming. The surface-acoustic-wave filter 124 can be the thin-film surface-acoustic-wave filter 126 of FIG. 3-1 or the high-quality temperature-compensated surface-acoustic-wave filter 128 of FIG. 3-2. A two-dimensional top-down view 404 of the surface-acoustic-wave filter 124 is illustrated on the left side of FIG. 4. In the depicted configuration, the electrode structure 302 of the surface-acoustic-wave filter 124 includes a first busbar 406-1, a second busbar 406-2, and fingers 408-1, 408-2, 408-3, and 408-4. The fingers 408-1 and 408-3 are connected to the first busbar 406-1 and extend along the second (Y) axis 320 towards the second busbar 406-2 without connecting to the second busbar 406-2. The fingers 408-2 and 408-4 are connected to the second busbar 406-2 and extend along the second (Y) axis 320 towards the first busbar 406-1 without connecting to the first busbar 406-1.

The surface-acoustic-wave filter 124 includes multiple distinct regions along the second (Y) axis 320. These regions are defined, at least in part, based on a physical layout of the electrode structure 302. The regions include a busbar region 410, the barrier region 310, and the central region 312. The busbar region 410 includes the busbars 406-1 and 406-2 and extends across portions of the second (Y) axis 320 that correspond with the widths of the busbars 406-1 and 406-2. In this case, two busbar regions 410 are shown to be associated with the two busbars 406-1 and 406-2, respectively.

The barrier region 310 is present between the central region 312 and the busbar region 410. In particular, the barrier region 310 includes portions of the second (Y) axis 320 that extend between one busbar and the ends of fingers associated with another busbar (e.g., an opposite busbar). For example, a first barrier region 310 exists between the first busbar 406-1 and the ends of fingers 408-2 and 408-4, which are associated with the second busbar 406-2. A second barrier region 310 exists between the second busbar 406-2 and ends of fingers 408-1 and 408-3, which are associated with the first busbar 406-1.

The central region 312 is defined by the overlap of fingers 408-1 to 408-4 across the first (X) axis 318. As depicted in the top-down view 404, the central region 312 includes at least one active track region 412 and at least one trap region 414. The trap region 414 is present between the barrier region 310 and the active track region 412. In this way, the trap region 414 exists at the outer boundaries of the central region 312. In general, the main or fundamental mode of the surface-acoustic-wave filter 124 is designed to propagate within the active track region 412.

A width of the trap region 414 along the second (Y) axis 320 can be tailored to achieve a target performance. In an example implementation, the width of the trap region 414 is approximately equal to the pitch 316 (of FIG. 3-1 or 3-2) of the electrode structure 302. For example, the width of the trap region 414 and the pitch 316 can be approximately 1 micrometer (μm). For clarity, the regions of the surface-acoustic-wave filter 124 are not necessarily drawn to scale in the top-down view 404. Further, each region may have some variability that deviates from the illustrated proportions or widths, including due to the constraints of a given manufacturing technology. For example, the trap region 414 may extend beyond the ends of fingers over which the trap region 414 is disposed.

With the implementation of site-selective piezoelectric-layer trimming, structural characteristics of the piezoelectric layer 304 within the trap region 414 can vary from the other regions, including the active track region 412. This variation causes the acoustic wave 314 (of FIG. 3-1 or 3-2) to have a lower velocity (e.g., a lower transversal velocity) than within the active track region 412, as seen by a graph 402 illustrated on the right of FIG. 4.

The graph 402 depicts a velocity profile 416 and a mode profile 418 across the second (Y) axis 320 and a horizontal axis 420. The velocity profile 416 is illustrated using a solid line, and the mode profile 418 is illustrated using a dashed line. The horizontal axis 420 represents velocity (e.g., velocity of the acoustic wave 314) for the velocity profile 416 and amplitude for the mode profile 418. Using site-selective piezoelectric-layer trimming, the velocity profile 416 can be designed to reduce (suppress) spurious transversal modes and promote excitation of the main or fundamental wave mode.

The velocity profile 416 indicates velocities (e.g., wave velocities) of each region of the surface-acoustic-wave filter 124. As seen in the graph 402, the velocity of the acoustic wave 314 is higher within the busbar region 410 and the barrier region 310 in comparison to the central region 312. In general, the acoustic wave 314 can readily propagate in regions in which the velocity is lower, such as within the central region 312. The relatively higher velocity within the barrier region 310 and the busbar region 410 effectively forms a barrier, which isolates the central region 312 and reduces leakage (e.g., loss) within the surface-acoustic-wave filter 124.

Within the central region 312, the velocity is lower within the trap region 414 in comparison to the active track region 412. The lower velocity within the trap region 414 can shape the transversal profile (e.g., amplitude) of the fundamental mode, which is depicted by the mode profile 418. As an example, a difference in velocities between the active track region 412 and the trap region 414 can be on the order of tens of meters per second (m/s). In an example implementation, the difference in velocities is between approximately 30 and 40 m/s.

The mode profile 418 indicates the amplitude of the fundamental wave mode across the different regions. In this example, the mode profile 418 has a rectangular or pulse shape, which corresponds to a piston mode in which spurious transversal modes are substantially suppressed (e.g., attenuated). The piston mode is characterized by the amplitude being generally flat (e.g., the same) across the active track region 412 and higher within the active track region 412 in comparison to the busbar and barrier regions 410 and 310. To achieve the desired mode profile 418 and suppress spurious transversal modes, site-selective piezoelectric-layer trimming tailors a height (e.g., thickness) of the piezoelectric layer 304 within the trap region 414, as further described with respect to FIG. 5.

Figure 5:
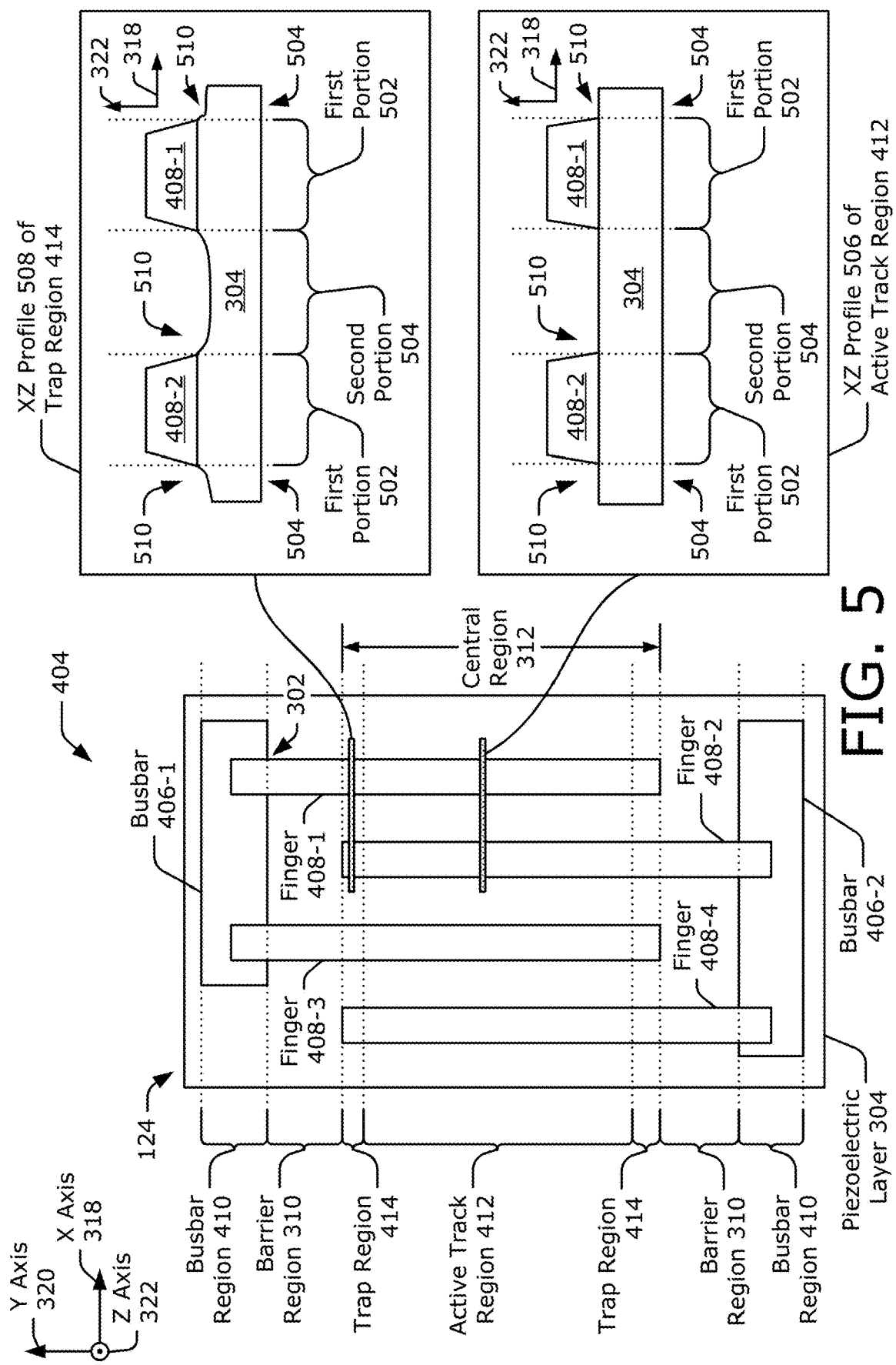
FIG. 5 illustrates example variations in a piezoelectric layer resulting from site-selective piezoelectric-layer trimming.

FIG. 5 illustrates example variations in the piezoelectric layer 304 resulting from site-selective piezoelectric-layer trimming In the depicted configuration, the electrode structure 302 has a comb shape. Due to this comb shape, the fingers 408-1 to 408-4 are distributed across the first (X) axis 318 and have lengths along the second (Y) axis 320. This distribution causes consecutive pairs of fingers 408-1 to 408-4 to be separated across the first (X) axis 318. This separation forms gaps (e.g., openings) within the electrode structure 302. Within the central region 312, for example, there are gaps between fingers 408-1 and 408-2, between fingers 408-2 and 408-3, and between fingers 408-3 and 408-4. The electrode structure 302 can also be considered to have gaps to the left of the finger 408-4 (as depicted in FIG. 5) and to the right of the finger 408-1. The electrode structure 302 can further be considered to have gaps within the barrier region 310 and across portions of the busbar region 410 that are not occupied by the busbars 406-1 and 406-2.

Different portions of the piezoelectric layer 304 can be defined with respect to the electrode structure 302. A first portion 502 of the piezoelectric layer 304 is covered by the electrode structure 302. This first portion 502 (e.g., a covered portion) supports (e.g., physically supports) the electrode structure 302 and is positioned directly below (as shown in FIG. 5) the electrode structure 302 along the third (Z) axis 322. In the two-dimensional top-down view 404 of the surface-acoustic-wave filter 124, the first portion 502 is not visible as it is underneath the electrode structure 302.

A second portion 504 of the piezoelectric layer 304 is exposed by the gaps within the electrode structure 302. The second portion 504 (e.g., an exposed portion) does not support (e.g., is not physically in direct contact with) the electrode structure 302 and is not positioned directly below the electrode structure 302. Within the central region 312, the second portion 504 exists between consecutive pairs of fingers 408-1 to 408-4. The second portion 504 also exists to the left of finger 408-4 and to the right of the finger 408-1.

In the two-dimensional top-down view 404 of the surface-acoustic-wave filter 124, the second portion 504 of the piezoelectric layer 304 includes the surface of the piezoelectric layer 304 that is visible and not "hidden" by the electrode structure 302. The first and second portions 502 and 504 are also depicted in XZ profiles 506 and 508 of the surface-acoustic-wave filter 124.

Consider the XZ profile 506 of the surface-acoustic-wave filter 124 within the active track region 412 shown at the bottom right of FIG. 5. Here, the first portion 502 of the piezoelectric layer 304 is shown to be below the fingers 408-1 and 408-2 of the electrode structure 302 along the third (Z) axis 322. Gaps 510 are present on the left and right sides of the fingers 408-1 and 408-2. These gaps 510 cause the second portion 504 of the piezoelectric layer 304 to not be covered by the electrode structure 302. Within the active track region 412 (as shown by the XZ profile 506), the height of the piezoelectric layer 304 is relatively constant across the first portion 502 and the second portion 504 (e.g., along the first (X) axis 318). Although not shown, the height of the piezoelectric layer 304 can also be relatively constant across the first (X) axis 318 within the busbar region 410 and the barrier region 310.

To realize the velocity and mode profiles 416 and 418 of FIG. 4, site-selective piezoelectric-layer trimming removes, within the trap region 414, some of the piezoelectric layer 304 that is exposed by gaps 510 within the electrode structure 302. Consider the XZ profile 508 of the surface-acoustic-wave filter 124 within the trap region 414 shown at the top right of FIG. 5. Here, the removal of some of the piezoelectric layer 304 causes the second portion 504 to have a smaller height (e.g., a smaller thickness) compared to the height of the first portion 502. In this way, the height of the piezoelectric layer 304 changes across the first (X) axis 318 within the trap region 414, as further described with respect to FIG. 6-1.

Figures 1, 6:
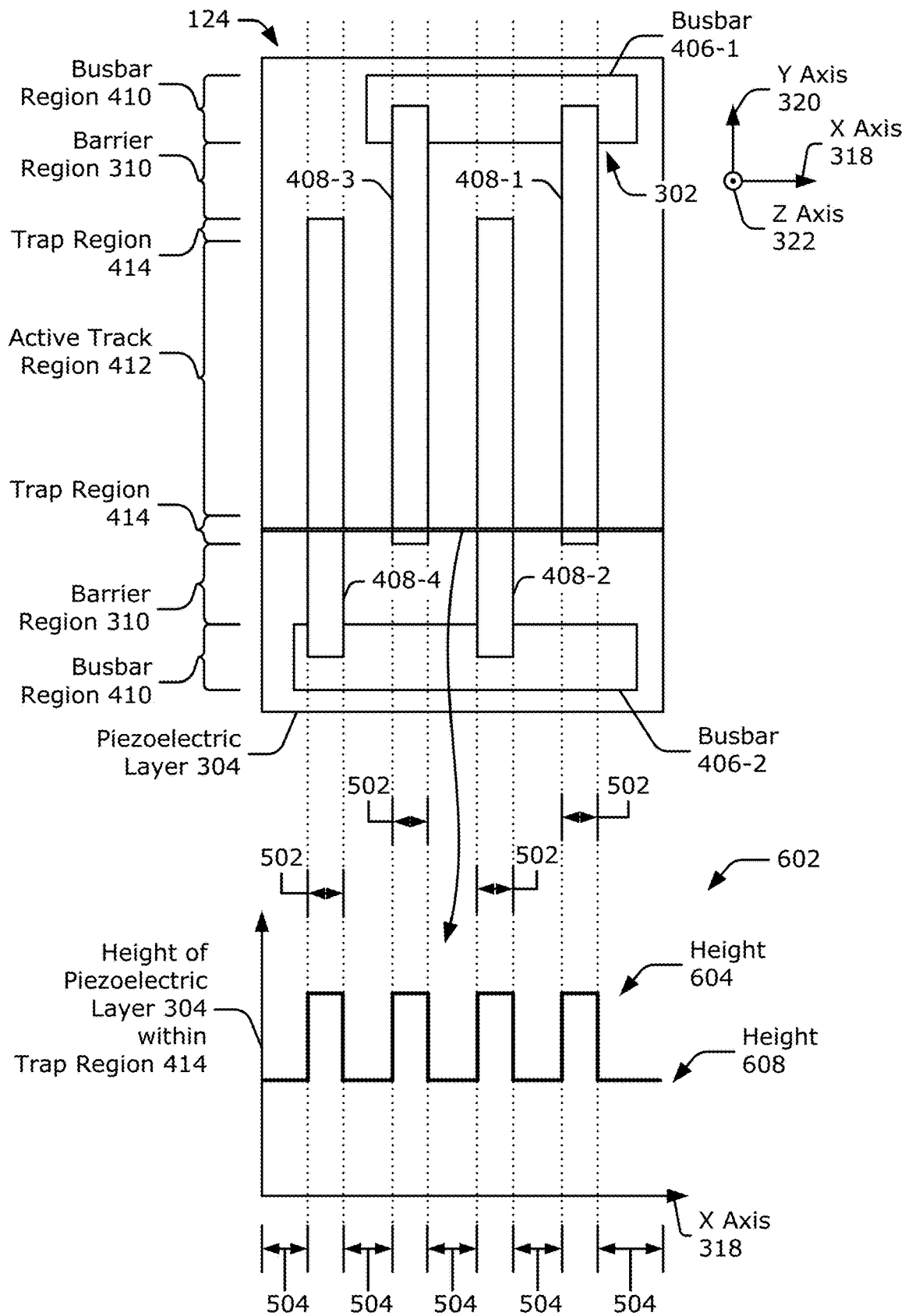
Figures 2, 6:
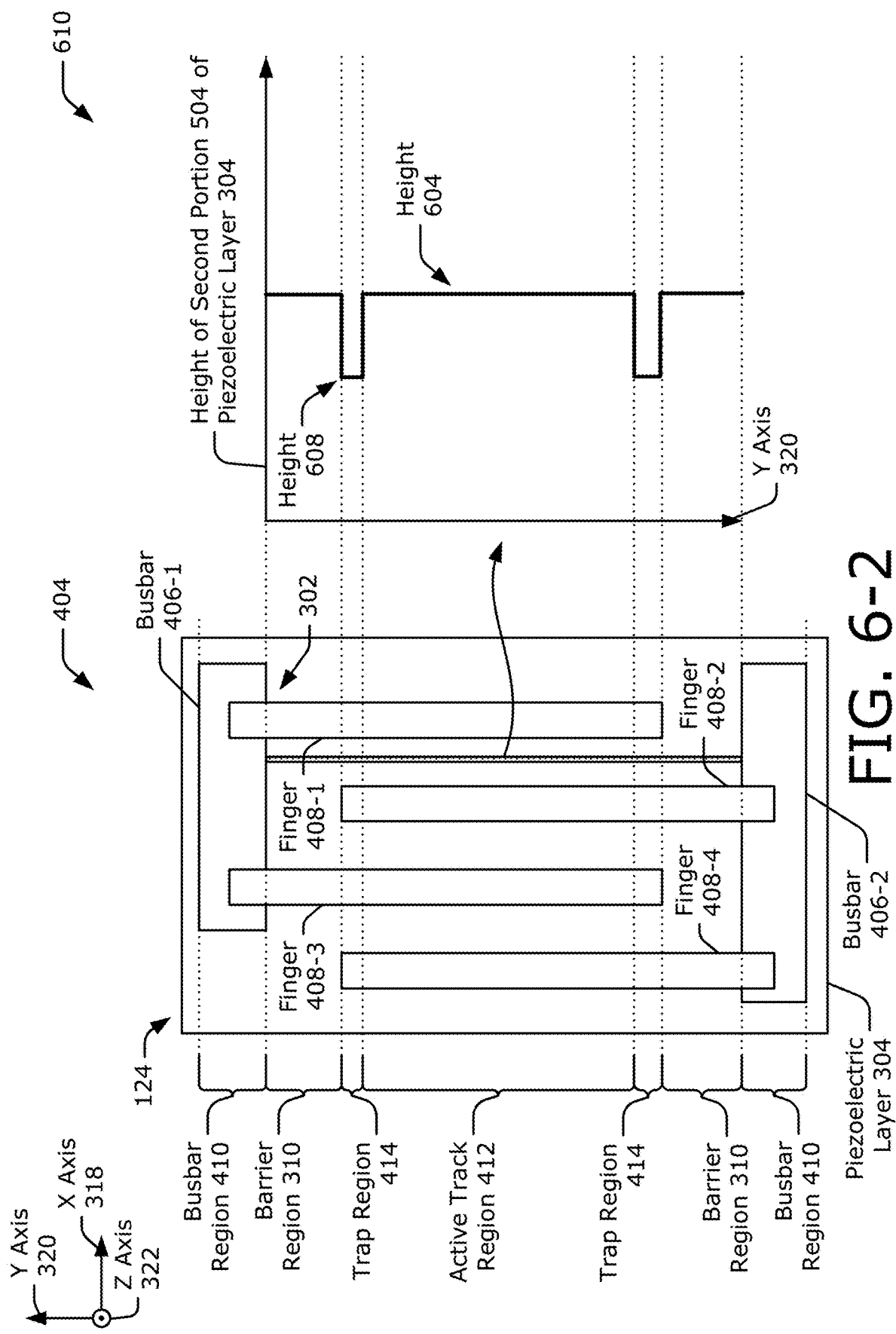

In FIG. 6-1, graph 602 plots the height of the piezoelectric layer 304 within the trap region 414. As illustrated in the graph 602, the height of the piezoelectric layer 304 varies across the first (X) axis 318. In particular, the first portion 502 of the piezoelectric layer 304 has a height 604, and the second portion 504 of the piezoelectric layer 304 has a height 608. The height 608 of the second portion 504 is smaller than the height 604 of the first portion 502 due to the trimming process, which removes some of the material within the second portion 504 of the piezoelectric layer 304.

Returning to FIG. 5, a comparison between the XZ profile 506 of the active track region 412 and the XZ profile 508 of the trap region 414 illustrates that the height of the second portion 504 of the piezoelectric layer 304 also varies across the regions of the surface-acoustic-wave filter 124 (e.g., along the second (Y) axis 320 direction). In particular, the second portion 504 has a smaller height within the trap region 414 in comparison to the active track region 412. Although not explicitly shown, the second portion 504 can also have a smaller height within the trap region 414 in comparison to the barrier region 310 or the busbar region 410. In this manner, the height of the second portion 504 of the piezoelectric layer 304 changes across the second (Y) axis 320, as further described with respect to FIG. 6-2.

In FIG. 6-2, graph 610 plots the height of the second portion 504 of the piezoelectric layer 304 along a gap 510 between the fingers 408-1 and 408-2. As illustrated in the graph 610, the height of the second portion 504 of the piezoelectric layer 304 varies across the second (Y) axis 320. In particular, the second portion 504 of the piezoelectric layer 304 has the height 604 within the busbar region 410, the barrier region 310, and the active track region 412. In the trap region 414, however, the second portion 504 of the piezoelectric layer 304 has the height 608, which is smaller than the height 604.

Returning to FIG. 5, a portion of the electrode structure 302 within the trap region 414 may or may not change as a result of site-selective piezoelectric-layer trimming In the XZ profiles 506 and 508, a structure and shape of the fingers 408-1 and 408-2 remains substantially the same across the active track region 412 and the trap region 414. In some processes, however, the structure and/or shape of the fingers 408-1 and 408-2 can vary, as further described with respect to FIG. 7.

Figure 7:
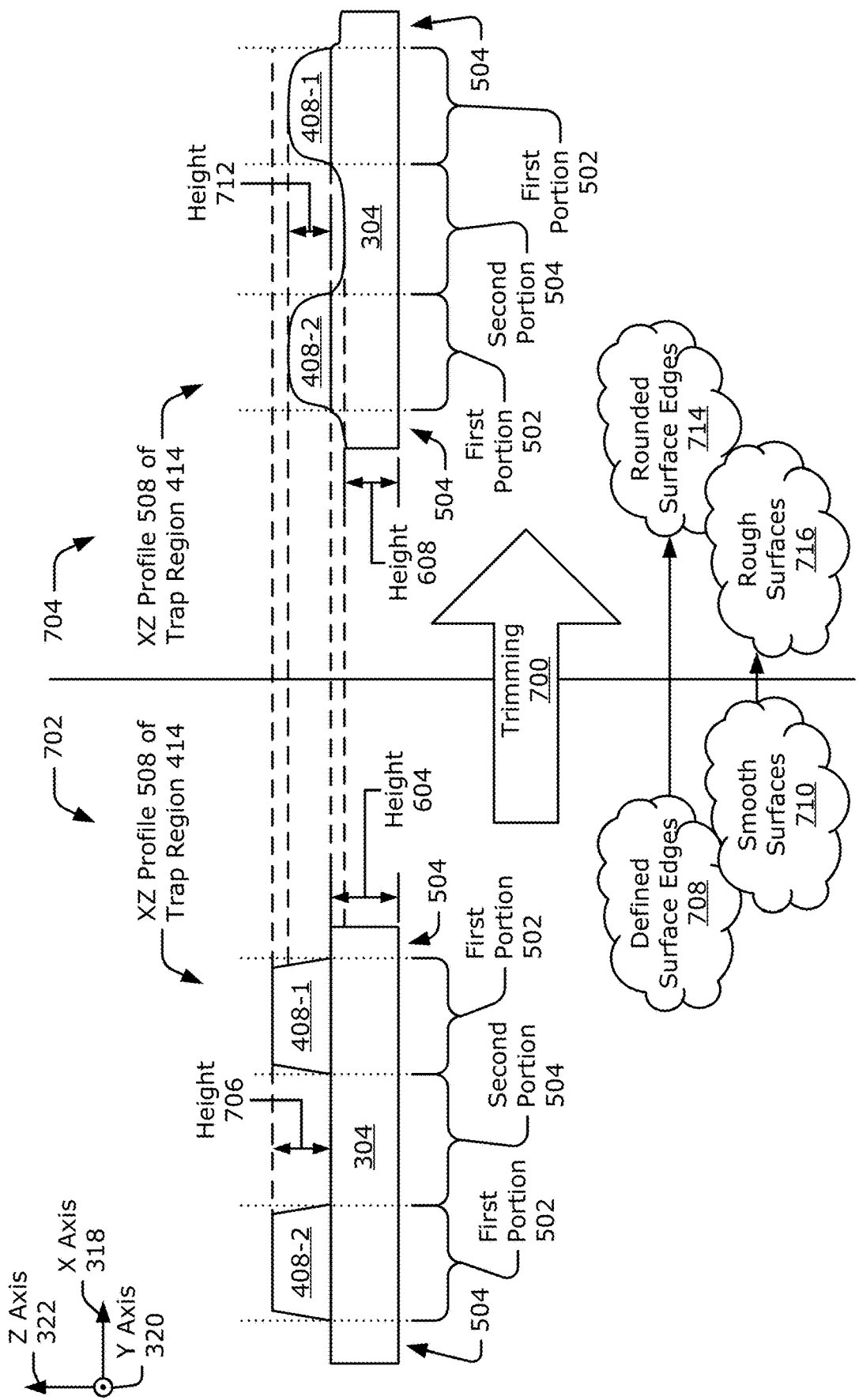
FIG. 7 illustrates changes in a trap region of a surface-acoustic-wave filter caused by site-selective piezoelectric-layer trimming.

FIG. 7 illustrates changes in the trap region 414 of the surface-acoustic-wave filter 124 caused by site-selective piezoelectric-layer trimming 700 (trimming 700). In this example, the site-selective piezoelectric-layer trimming 700 affects both the electrode structure 302 and the exposed portions of the piezoelectric layer 304 (e.g., the second portion 504). In other implementations, the site-selective piezoelectric-layer trimming 700 can affect the exposed portions of the piezoelectric layer 304 without substantially affecting the electrode structure 302.

In general, site-selective piezoelectric-layer trimming 700 is a trimming process that is applied over a specific swath of the surface-acoustic-wave filter 124. To suppress spurious transversal modes, that specific swath includes the trap region 414. Examples of the site-selective piezoelectric-layer trimming 700 process is further described with respect to FIG. 9.

The XZ profile 508 of the trap region 414 prior to site-selective piezoelectric-layer trimming 700 is illustrated at 702 on the left side of FIG. 7. Prior to site-selective piezoelectric-layer trimming 700, the XZ profile 508 of the trap region 414 can be similar to the XZ profile 506 of the active track region 412 shown in FIG. 5. For example, the second portion 504 of the piezoelectric layer 304 can have the height 604. Additionally, the second portion 504 of the piezoelectric layer 304 and the first portion 502 of the piezoelectric layer 304 can have similar heights. In this example, the fingers 408-1 and 408-2 have a height 706. Also, a structure of the fingers 408-1 and 408-2 can be characterized as having defined surface edges 708 and smooth surfaces 710.

The XZ profile 508 of the trap region 414 after site-selective piezoelectric-layer trimming 700 is illustrated at 704 on the right side of FIG. 7. After site-selective piezoelectric-layer trimming 700, material is removed from the second portion 504 of the piezoelectric layer 304. Consequently, the height of the second portion 504 is reduced from height 604 at 702 to height 608 at 704. This causes the height of the second portion 504 to be different than the height of the first portion 502 within the trap region 414 at 704. As an example, the height of the second portion 504 can be reduced by approximately 1 nanometer (nm) or more (e.g., reduced by approximately 5 nm, 7.5 nm, 10 nm, 20 nm, 30 nm, 40 nm, or more). The amount at which the height of the second portion 504 of the piezoelectric layer 304 is reduced can be tailored to achieve a target velocity profile 416 and mode profile 418.

A structure of the fingers 408-1 and 408-2 can also change as a result of site-selective piezoelectric-layer trimming 700. For example, material can be removed from the fingers 408-1 and 408-2. Consequently, the height of the fingers 408-1 and 408-2 within the trap region 414 is reduced from height 706 at 702 to height 712 at 704. As an example, the height of the fingers 408-1 and 408-2 within the trap region 414 can be reduced by approximately 1 nm or more (e.g., reduced by approximately 5 nm, 10 nm, 15 nm, 20 nm, 25 nm, or more).

Additionally, the defined surface edges 708 at 702 can become rounded, which results in rounded surface edges 714 at 704. Furthermore, the smooth surfaces 710 at 702 can become rougher, which results in rough surfaces 716 at 704. Sometimes different trimming processes can affect a degree to which the electrode structure 302 within the trap region 414 is rounded and roughened.

Due to site-selective piezoelectric-layer trimming 700, the structure of the piezoelectric layer 304 (and sometimes the structure of the electrode structure 302 as described in FIG. 7) becomes non-homogenous across the second (Y) axis 320 (e.g., across the various regions including the trap region 414 and the active track region 412). In addition to changing physical dimensions of the piezoelectric layer 304, the site-selective piezoelectric-layer trimming 700 can also change a molecular structure of the piezoelectric layer 304, as further described with respect to FIG. 8.

Figure 8:
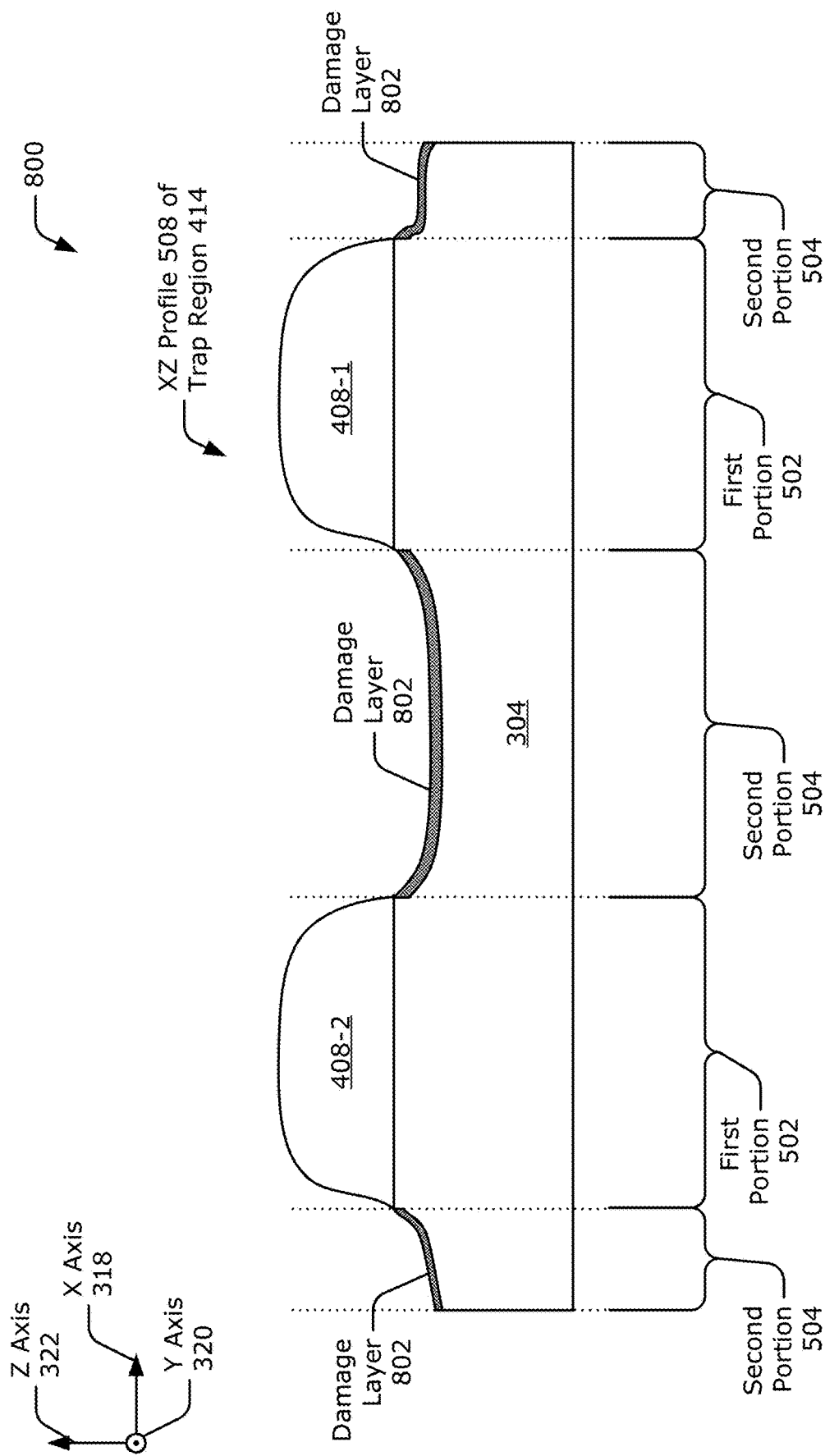
FIG. 8 illustrates a damage layer resulting from site-selective piezoelectric-layer trimming.

FIG. 8 illustrates a close-up (zoomed-in version) of the XZ profile 508 of the trap region 414 depicted at 704 in FIG. 7. At 800, a damage layer 802 exists across the second portion 504 of the piezoelectric layer 304. The damage layer 802 forms across the surface of the second portion 504 of the piezoelectric layer 304. The damage layer 802 is distinct from (e.g., has different characteristics than) the piezoelectric layer 304. In one example, the damage layer 802 includes an amorphous structure that does not exhibit the ordered arrangement of the piezoelectric layer 304's crystalline structure, which exists "below" the damage layer 802 along the third (Z) axis 322. In a second example, the damage layer 802 may not exhibit piezoelectric properties or exhibits reduced piezoelectric properties.

A thickness of the damage layer 802 can vary based on the process used for site-selective piezoelectric-layer trimming 700. As an example, the thickness of the damage layer 802 can be at least approximately 10 nm (e.g., approximately 13 nm, 15 nm, 18 nm, 20 nm, or more). In some implementations, the damage layer 802 includes aluminium oxide ($Al_2O_3$). The existence of the damage layer 802 provides an indication that site-selective piezoelectric-layer trimming 700 was used to manufacture the surface-acoustic-wave filter 124. The site-selective piezoelectric-layer trimming 700 process is further described with respect to FIG. 9.

FIG. 9 is a flow diagram illustrating an example process 900 for manufacturing a surface-acoustic-wave filter 124 using site-selective piezoelectric-layer trimming. The process 900 is described in the form of a set of blocks 902-906 that specify operations that can be performed. However, operations are not necessarily limited to the order shown in FIG. 9 or described herein, for the operations may be implemented in alternative orders or in fully or partially overlapping manners. Also, more, fewer, and/or different operations may be implemented to perform the process 900, or an alternative process. Operations represented by the illustrated blocks of the process 900 may be performed to manufacture the surface-acoustic-wave filter 124 (e.g., of FIGS. 1-4). More specifically, the operations of the process 900 may be performed, at least in part, to trim an exposed portion of the piezoelectric layer 304 (e.g., of FIG. 3, 5, or 7) within the trap region 414. The operations of the process 900 can also optionally trim a portion of the electrode structure 302 within the trap region 414.

At block 902, a surface-acoustic-wave filter is provided. The surface-acoustic-wave filter comprises an electrode structure and a piezoelectric layer. The electrode structure has multiple gaps. The piezoelectric layer comprises a first portion that supports the electrode structure and a second portion that is exposed by the multiple gaps of the electrode structure.

For example, the manufacturing process provides the surface-acoustic-wave filter 124. The surface-acoustic-wave filter 124 can be a thin-film surface-acoustic-wave filter 126 or a high-quality temperature-compensated surface-acoustic-wave filter 128. The surface-acoustic-wave filter 124 includes the electrode structure 302 and the piezoelectric layer 304, as shown in FIG. 3-1 or 3-2. The electrode structure 302 includes multiple gaps 510. The piezoelectric layer includes a first portion 502 (e.g., a covered portion) and a second portion 504 (e.g., an exposed portion), as shown in FIG. 5. The first portion 502 supports the electrode structure 302, and the second portion 504 is exposed by the multiple gaps 510 of the electrode structure 302.

At block 904, an active track region of a surface-acoustic-wave filter is masked with photoresist. For example, the manufacturing process masks (e.g., covers) the active track region 412 with photoresist. The active track region 412 is illustrated in FIG. 4.

Although not explicitly mentioned above, the manufacturing process can also mask the busbar region 410 and the barrier region 310. In some processes, all the regions except the trap region 414 can be masked with photoresist. In other processes, the electrode structure 302 within the trap region 414 is also masked with photoresist. The photoresist acts as a protective cover during the site-selective piezoelectric-layer trimming process. In this way, the photoresist prevents material from being removed from portions of the piezoelectric layer 304 and the electrode structure 302 that are covered by the photoresist.

At block 906, the second portion of the piezoelectric layer within the trap region of the surface-acoustic-wave filter is trimmed. The trimming reduces a first height of the second portion of the piezoelectric layer within the trap region relative to a second height of the second portion of the piezoelectric layer within the active track region.

For example, the manufacturing process trims the second portion 504 of the piezoelectric layer 304 within the trap region 414 of the surface-acoustic-wave filter 124. Because the second portion 504 of the piezoelectric layer 304 within the trap region 414 is not protected by the photoresist, some of the second portion 504 of the piezoelectric layer 304 is removed. The trimming involves reducing the height of the second portion 504 of the piezoelectric layer 304 within the trap region 414 relative to the height of the second portion 504 of the piezoelectric layer 304 within the active track region 412. For example, the second portion 504 can have the height 608 within the trap region 414 and the height 604 within the active track region 412, as shown in FIG. 6-2.

In some manufacturing processes, the trimming involves using photolithography. Other manufacturing processes are also possible, including those that use an etching process, such as a dry-etching process. During the trimming process, the second portion 504 of the piezoelectric layer 304 within the trap region 414 can be exposed to a gas, such as diatomic oxygen ($O_2$), nitrogen trifluoride ($NF_3$), or argon (Ar). In general, the trimming process can be tailored to realize a target amount of trimming of the piezoelectric layer 304 that achieves a target velocity profile 416 and a target mode profile 418.

The manufacturing process can cause a damage layer 802 to form across the second portion 504 of the piezoelectric layer 304. As described above, the damage layer 802 has different characteristics from the piezoelectric layer 304. For example, the damage layer 802 has an amorphous structure while the piezoelectric layer 304 has a crystalline structure. Also, the damage layer 802 may not exhibit piezoelectric properties whereas the piezoelectric layer 304 does.

At block 908, the photoresist is removed from the active track region. For example, the manufacturing process removes the photoresist from the active track region 412. Using site-selective piezoelectric-layer trimming, the structure of the second portion 504 of the piezoelectric layer 304 within the trap region 414 differs from the structure of the second portion 504 of the piezoelectric layer 304 within other regions. Additionally, the structure of the second portion 504 of the piezoelectric layer 304 within the trap region 414 differs from the structure of the first portion 502 of the piezoelectric layer 304 within the trap region 414.

In some implementations, the techniques for site-selective piezoelectric-layer trimming are combined with other techniques. For example, the techniques for site-selective piezoelectric-layer trimming can be combined with other piston-mode techniques, including those that apply hammerheads and/or dots to the electrode structure 302.

As another example, the techniques for site-selective piezoelectric-layer trimming can also be used with frequency trimming Frequency trimming applies a trimming process across the surface-acoustic-wave filter 124 to tune a frequency (e.g., a main mode frequency) of the surface-acoustic-wave filter 124. In particular, the frequency trimming reduces the velocity of the acoustic wave 314 to a target velocity, which achieves a target frequency.

In some implementations, frequency trimming is applied across at least the central region 312 of the surface-acoustic-wave filter 124. In this way, both the trap region 414 and the active track region 412 are trimmed by similar amounts. In other words, the height of the second portion 504 of the piezoelectric layer 304 is relatively constant across the second (Y) axis 320. However, by combining the techniques of frequency trimming with those of site-selective piezoelectric-layer trimming, the site-selective piezoelectric-layer trimming causes the height of the second portion 504 of the piezoelectric layer 304 to vary between the active track region 412 and the trap region 414 along the second (Y) axis 320.

Although the techniques for site-selective piezoelectric-layer trimming have been described with respect to a trimming process, there can be other manufacturing processes that can result in the piezoelectric layer 304 having a smaller height between the fingers 408 in the trap region 414 in comparison to the active track region 412. Example alternative manufacturing processes can layer the piezoelectric layer 304 appropriately to cause the piezoelectric layer 304 within the trap region 414 to have a smaller height than the piezoelectric layer 304 within the active track region 412.

The techniques described herein can apply to a variety of different types of surface-acoustic-wave filters 124, including the thin-film surface-acoustic-wave filter 126 of FIG. 1 or the high-quality temperature-compensated surface-acoustic-wave filter 128 of FIG. 1.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

Some aspects are described below.

Aspect 1: An apparatus for filtering, the apparatus comprising:
  at least one surface-acoustic-wave filter comprising:
    an electrode structure having multiple gaps; and
    a piezoelectric layer having a planar surface defined by a first (X) axis and a second (Y) axis that is perpendicular to the first (X) axis, the piezoelectric layer configured to propagate an acoustic wave along the first (X) axis, the piezoelectric layer comprising:
      a first portion that supports the electrode structure; and
      a second portion that is exposed by the multiple gaps of the electrode structure, the second portion having different heights across the second (Y) axis, the different heights defined with respect to a third (Z) axis that is substantially normal to the planar surface.

Aspect 2: The apparatus of aspect 1, wherein:
the electrode structure comprises multiple fingers distributed across the first (X) axis and having lengths substantially parallel to the second (Y) axis;
the multiple fingers comprise a consecutive pair of fingers separated across the first (X) axis, the separation forming a gap of the multiple gaps;
the first portion of the piezoelectric layer supports the consecutive pair of fingers; and
the second portion of the piezoelectric layer is present between the consecutive pair of fingers.

Aspect 3: The apparatus of aspect 1 or 2, wherein:
the first portion of the piezoelectric layer has a first height along the third (Z) axis; and
the different heights of the second portion of the piezoelectric layer comprise:
  the first height; and
  a second height along the third (Z) axis that is smaller than the first height.

Aspect 4: The apparatus of aspect 3, wherein:
the electrode structure comprises:
  a first comb-shaped structure comprising a first busbar and a first set of fingers extending from the first busbar; and
  a second comb-shaped structure comprising a second busbar and a second set of fingers extending from the first busbar;
the first comb-shaped structure and the second comb-shaped structure are physically separated from each other;
the first set of fingers of the first comb-shaped structure and the second set of fingers of the second comb-shaped structure are arranged in an interlocking manner that creates a region of overlap between the first set of fingers and the second set of fingers;
the region of overlap extends across the first (X) axis and comprises a portion of the second (Y) axis; and
the second portion of the piezoelectric layer has the second height at least at one end of the region of overlap.

Aspect 5: The apparatus of aspect 3, wherein a difference between the first height and the second height is at least approximately 5 nanometers.

Aspect 6: The apparatus of aspect 5, wherein a difference between the first height and the second height is at least approximately 20 nanometers.

Aspect 7: The apparatus of any of aspects 3-6, wherein:
the piezoelectric layer has a crystalline structure; and
the surface-acoustic-wave filter comprises a damage layer disposed across a surface of the second portion of the piezoelectric layer that has the second height, the damage layer defined by an amorphous structure.

Aspect 8: The apparatus of any previous aspect, wherein:
the different heights comprise a first height and a second height;
the surface-acoustic-wave filter comprises:
  a first region extending across the first (X) axis and comprising a first section along the second (Y) axis; and
  a second region extending across the first (X) axis and comprising a second section along the second (Y) axis; and
the second portion of the piezoelectric layer has:
  the first height within the first region; and
  the second height within the second region, the second height smaller than the first height.

Aspect 9: The apparatus of aspect 8, wherein:
the second region comprises a pair of disjoint regions; and
the first region is present between the pair of disjoint regions along the second (Y) axis.

Aspect 10: The apparatus of aspect 9, wherein:
the first region comprises an active track region configured to cause the acoustic wave to have a first velocity within the active track region; and
the pair of disjoint regions comprises trap regions configured to cause the acoustic wave to have a second velocity within the trap regions, the second velocity lower than the first velocity.

Aspect 11: The apparatus of any of aspects 8-10, wherein the electrode structure has:
  a third height along the third (Z) axis within the first region; and
  a fourth height along the third (Z) axis within the second region, the fourth height smaller than the third height.

Aspect 12: The apparatus of any of aspects 8-11, wherein the electrode structure has:
  a first surface within the first region; and
  a second surface within the second region, the second surface rougher than the first surface.

Aspect 13: The apparatus of any of aspects 8-12, wherein the electrode structure has:
  first surface edges within the first region; and
  second surface edges within the second region, the second surface edges more round than the first surface edges.

Aspect 14: The apparatus of any of aspects 8, wherein a width of the second region across the second (Y) axis is approximately equal to a pitch associated with the electrode structure.

Aspect 15: The apparatus of any preceding aspect, further comprising:
  a wireless transceiver coupled to at least one antenna, the wireless transceiver:
    comprising the surface-acoustic-wave filter; and
    configured to filter, using the surface-acoustic-wave filter, a wireless signal communicated via the at least one antenna.

Aspect 16: The apparatus of aspect 15, wherein the wireless signal comprises frequencies that are greater than or equal to approximately 2 gigahertz.

Aspect 17: The apparatus of aspect 16, wherein the wireless signal further comprises frequencies that are greater than or equal to approximately 5 gigahertz.

Aspect 18: The apparatus of any preceding aspect, wherein the surface-acoustic-wave filter comprises a thin-film surface-acoustic-wave filter.

Aspect 19: The apparatus of any of aspects 1-17, wherein the surface-acoustic-wave filter comprises a high-quality temperature-compensated surface-acoustic-wave filter.

Aspect 20: An apparatus for filtering, the apparatus comprising:
  at least one surface-acoustic-wave filter configured to generate a filtered signal from a radio-frequency signal, the surface-acoustic-wave filter comprising:
    electrode means for converting the radio-frequency signal to an acoustic wave and converting a propagated acoustic wave into the filtered signal, the electrode means having multiple gaps; and
    means for propagating the acoustic wave to produce the propagated acoustic wave along a first (X) axis, the means for propagating the acoustic wave having a planar surface defined by the first (X) axis and a second (Y) axis that is perpendicular to the first (X) axis, the means for propagating the acoustic wave comprising:
      a first portion that supports the electrode means; and
      a second portion that is exposed by the multiple gaps of the electrode means, the second portion having different heights across the second (Y) axis, the different heights defined with respect to a third (Z) axis that is substantially normal to the planar surface.

Aspect 21: The apparatus of aspect 20, wherein:
  the first portion of the means for propagating the acoustic wave has a first height along the third (Z) axis; and
  the different heights of the second portion of the means for propagating the acoustic wave comprise:
    the first height; and
    a second height along the third (Z) axis that is smaller than the first height.

Aspect 22: The apparatus of aspect 21, wherein:
  the means for propagating the acoustic wave has a crystalline structure; and
  the surface-acoustic-wave filter comprises a damage layer disposed across a surface of the second portion of the means for propagating the acoustic wave that has the second height, the damage layer defined by an amorphous structure.

Aspect 23: A method of manufacturing a surface-acoustic-wave filter, the method comprising:
  providing a surface-acoustic-wave filter comprising an electrode structure and a piezoelectric layer, the electrode structure having multiple gaps, the piezoelectric layer comprising a first portion that supports the electrode structure and a second portion that is exposed by the multiple gaps of the electrode structure;
  masking an active track region of the surface-acoustic-wave filter with photoresist;
  trimming the second portion of the piezoelectric layer within a trap region of the surface-acoustic-wave filter, the trimming comprising reducing a first height of the second portion of the piezoelectric layer within the trap region relative to a second height of the second portion of the piezoelectric layer within the active track region; and
  removing the photoresist from the active track region.

Aspect 24: The method of aspect 23, further comprising:
  trimming the electrode structure within the trap region, the trimming comprising reducing a third height of the electrode structure within the trap region relative to a fourth height of the electrode structure within the active track region.

Aspect 25: The method of aspects 23 or 24, wherein the trimming of the second portion of the piezoelectric layer comprises forming a damage layer on a surface of the second portion of the piezoelectric layer.

Aspect 26: The method of any of aspects 23-25, wherein:
  the trimming of the second portion of the piezoelectric layer comprises performing a dry-etching process; and
  the performing of the dry-etching processes comprises exposing the second portion of the piezoelectric layer within the trap region to a gas.

Aspect 27: The method of aspects 26, wherein the gas comprises at least one of:
  nitrogen trifluoride (NF3) gas;
  argon (AR) gas; or
  diatomic oxygen (O2) gas.

Aspect 28: A surface-acoustic-wave filter comprising:
  an electrode structure disposed within a first region and a second region, the electrode structure having multiple gaps, the first region extending across a first (X) axis and comprising a first section along a second (Y) axis, the second (Y) axis perpendicular to the first (X) axis, the second region extending across the first (X) axis and comprising a second section along the second (Y) axis;
  a piezoelectric layer disposed within the first region and the second region, the piezoelectric layer having a planar surface defined by the first (X) axis and the second (Y) axis, the piezoelectric layer comprising:
    a first portion that supports the electrode structure; and
    a second portion that is exposed by the multiple gaps of the electrode structure, the second portion comprising a crystalline structure; and
  a damage layer disposed across a surface of the second portion of the piezoelectric layer within the second region, the damage layer comprising an amorphous structure that differs from the crystalline structure.

Aspect 29: The surface-acoustic-wave filter of aspect 28, wherein the second portion of the piezoelectric layer has:
  a first height within the first region, the first height being along a third (Z) axis that is substantially normal to the planar surface; and
  a second height within the second region, the second height being along the third (Z) axis and smaller than the first height.

Aspect 30: The surface-acoustic-wave filter of aspect 28 or 29, wherein the electrode structure within the second region has a smaller height than the electrode structure within the first region.

Aspect 31: The surface-acoustic-wave filter of any of aspects 28-30, wherein the electrode structure within the second region has a rougher surface than the electrode structure within the first region.

Aspect 32: The surface-acoustic-wave filter of any of aspects 28-31, wherein the electrode structure within the second region has rounder edges than the electrode structure within the first region.

Aspect 33: The surface-acoustic-wave filter of any of aspects 28-32, wherein:
the piezoelectric layer is configured to propagate an acoustic wave across the planar surface along the first (X) axis;
the first region comprises an active track region configured to cause the acoustic wave to have a first velocity within the active track region; and
the second region comprises a trap region configured to cause the acoustic wave to have a second velocity within the trap region, the second velocity lower than the first velocity.

What is claimed is:

1. An apparatus for filtering, the apparatus comprising:
at least one surface-acoustic-wave filter comprising:
an electrode structure having multiple gaps defined by multiple fingers of the electrode structure; and
a piezoelectric layer having a planar surface defined by a first (X) axis and a second (Y) axis that is perpendicular to the first (X) axis, the piezoelectric layer configured to propagate an acoustic wave along the first (X) axis, the piezoelectric layer comprising:
a first portion that supports the electrode structure, the first portion having a substantially similar height across the second (Y) axis, the height defined with respect to a third (Z) axis that is substantially normal to the planar surface; and
a second portion that is exposed by the multiple gaps of the electrode structure supported by the first portion, the second portion of the piezoelectric layer comprising a surface portion extending at least partially between two adjacent fingers of the multiple fingers, the surface portion having two or more different heights across the second (Y) axis between the same two adjacent fingers of the multiple fingers, the two or more different heights defined with respect to the third (Z) axis.

2. The apparatus of claim 1, wherein:
the multiple fingers are distributed across the first (X) axis and have lengths substantially parallel to the second (Y) axis;
the multiple fingers comprise a consecutive pair of fingers separated across the first (X) axis and adjacent to one other, the separation forming a gap of the multiple gaps;
the first portion of the piezoelectric layer supports the consecutive pair of fingers; and
the second portion of the piezoelectric layer is present between the consecutive pair of fingers.

3. The apparatus of claim 1, wherein:
the first portion of the piezoelectric layer has a first height along the third (Z) axis; and
the two or more different heights of the second portion of the piezoelectric layer comprise:
the first height; and
a second height along the third (Z) axis that is smaller than the first height.

4. The apparatus of claim 3, wherein:
the electrode structure comprises:
a first comb-shaped structure comprising a first busbar and a first set of fingers of the multiple fingers, the first set of fingers extending from the first busbar; and
a second comb-shaped structure comprising a second busbar and a second set of fingers of the multiple fingers, the second set of fingers extending from the second busbar;
the first comb-shaped structure and the second comb-shaped structure are physically separated from each other;
the first set of fingers of the first comb-shaped structure and the second set of fingers of the second comb-shaped structure are arranged in an interlocking manner that creates a region of overlap between the first set of fingers and the second set of fingers;
the region of overlap extends across the first (X) axis and comprises a portion of the second (Y) axis; and
the second portion of the piezoelectric layer has the second height at least at one end of the region of overlap.

5. The apparatus of claim 3, wherein a difference between the first height and the second height is at least approximately 5 nanometers.

6. The apparatus of claim 3, wherein:
the piezoelectric layer has a crystalline structure; and
the surface-acoustic-wave filter comprises a damage layer disposed across a surface of the second portion of the piezoelectric layer that has the second height, the damage layer defined by an amorphous structure.

7. The apparatus of claim 1, wherein:
the two or more different heights comprise a first height and a second height;
the surface-acoustic-wave filter comprises:
a first region extending across the first (X) axis and comprising a first section along the second (Y) axis; and
a second region extending across the first (X) axis and comprising a second section along the second (Y) axis; and
the second portion of the piezoelectric layer has:
the first height within the first region; and
the second height within the second region, the second height smaller than the first height.

8. The apparatus of claim 7, wherein:
the second region comprises a pair of disjoint regions; and
the first region is present between the pair of disjoint regions along the second (Y) axis.

9. The apparatus of claim 7, wherein the electrode structure has:
a third height along the third (Z) axis within the first region; and
a fourth height along the third (Z) axis within the second region, the fourth height smaller than the third height.

10. The apparatus of claim 9, wherein the electrode structure has:
a first surface within the first region; and
a second surface within the second region, the second surface rougher than the first surface.

11. The apparatus of claim 9, wherein the electrode structure has:
first surface edges within the first region; and
second surface edges within the second region, the second surface edges more round than the first surface edges.

12. The apparatus of claim 7, wherein a width of the second region across the second (Y) axis is approximately equal to a pitch associated with the multiple fingers of the electrode structure.

13. The apparatus of claim 1, further comprising:
a wireless transceiver coupled to at least one antenna, the wireless transceiver:
comprising the surface-acoustic-wave filter; and
configured to filter, using the surface-acoustic-wave filter, a wireless signal communicated via the at least one antenna.

14. The apparatus of claim 13, wherein the wireless signal comprises frequencies that are greater than or equal to approximately 2 gigahertz.

15. The apparatus of claim 14, wherein the wireless signal further comprises frequencies that are greater than or equal to approximately 5 gigahertz.

16. The apparatus of claim 1, wherein the surface-acoustic-wave filter comprises a thin-film surface-acoustic-wave (TFSAW) filter.

17. The apparatus of claim 1, wherein the surface-acoustic-wave filter comprises a high-quality temperature-compensated surface-acoustic-wave (HQ-TC SAW) filter.

18. An apparatus for filtering, the apparatus comprising:
at least one surface-acoustic-wave filter comprising:
an electrode structure having multiple gaps;
a piezoelectric layer having a planar surface defined by a first (X) axis and a second (Y) axis that is perpendicular to the first (X) axis, the piezoelectric layer configured to propagate an acoustic wave along the first (X) axis, the piezoelectric layer comprising:
a first portion that supports the electrode structure; and
a second portion that is exposed by the multiple gaps of the electrode structure, the second portion having different heights across the second (Y) axis, the different heights defined with respect to a third (Z) axis that is substantially normal to the planar surface;
a first region extending across the first (X) axis and comprising a first section along the second (Y) axis, the first region comprising an active track region configured to cause the acoustic wave to have a first velocity within the active track region; and
a second region extending across the first (X) axis and comprising a pair of disjoined disjoint regions, the pair of disjoint regions comprising trap regions configured to cause the acoustic wave to have a second velocity within the trap regions, the second velocity lower than the first velocity.

19. An apparatus for filtering, the apparatus comprising:
at least one surface-acoustic-wave filter configured to generate a filtered signal from a radio-frequency signal, the surface-acoustic-wave filter comprising:
electrode means for converting the radio-frequency signal to an acoustic wave and converting a propagated acoustic wave into the filtered signal, the electrode means having multiple gaps defined by multiple fingers; and
means for propagating the acoustic wave to produce the propagated acoustic wave along a first (X) axis, the means for propagating the acoustic wave having a planar surface defined by the first (X) axis and a second (Y) axis that is perpendicular to the first (X) axis, the means for propagating the acoustic wave comprising:
a first portion that supports the electrode means, the first portion having a substantially similar height across the second (Y) axis, the height defined with respect to a third (Z) axis that is substantially normal to the planar surface; and
a second portion that is exposed by the multiple gaps of the electrode means supported by the first portion, the second portion of the means for propagating the acoustic wave comprising a surface portion extending at least partially between two adjacent fingers of the multiple fingers, the surface portion having two or more different heights across the second (Y) axis between the same two adjacent fingers of the multiple fingers, the two or more different heights defined with respect to the third (Z) axis.

20. The apparatus of claim 19, wherein:
the first portion of the means for propagating the acoustic wave has a first height along the third (Z) axis; and
the two or more different heights of the surface portion of the second portion of the means for propagating the acoustic wave comprise:
the first height; and
a second height along the third (Z) axis that is smaller than the first height.

21. The apparatus of claim 20, wherein:
the means for propagating the acoustic wave has a crystalline structure; and
the surface-acoustic-wave filter comprises a damage layer disposed across a surface of the second portion of the means for propagating the acoustic wave that has the second height, the damage layer defined by an amorphous structure.

22. A surface-acoustic-wave filter comprising:
an electrode structure disposed within a first region and a second region, the electrode structure having multiple gaps, the first region extending across a first (X) axis and comprising a first section along a second (Y) axis, the second (Y) axis perpendicular to the first (X) axis, the second region extending across the first (X) axis and comprising a second section along the second (Y) axis;
a piezoelectric layer configured to propagate an acoustic wave across a planar surface of the piezoelectric layer along the first (X) axis, the planar surface defined by the first (X) axis and the second (Y) axis, the piezoelectric layer disposed within the first region and the second region, the first region comprising an active track region configured to cause the acoustic wave to have a first velocity within the active track region, the second region comprising a trap region configured to cause the acoustic wave to have a second velocity within the trap region, the second velocity lower than the first velocity, the piezoelectric layer comprising:
a first portion that supports the electrode structure; and
a second portion that is exposed by the multiple gaps of the electrode structure, the second portion comprising a crystalline structure; and
a damage layer disposed across a surface of the second portion of the piezoelectric layer within the second region, the damage layer comprising an amorphous structure that differs from the crystalline structure.

23. The surface-acoustic-wave filter of claim 22, wherein the second portion of the piezoelectric layer has:
- a first height within the first region, the first height being along a third (Z) axis that is substantially normal to the planar surface; and
- a second height within the second region, the second height being along the third (Z) axis and smaller than the first height.

24. The surface-acoustic-wave filter of claim 22, wherein the electrode structure within the second region has a smaller height than the electrode structure within the first region.

25. The surface-acoustic-wave filter of claim 22, wherein the electrode structure within the second region has at least one of the following:
- a rougher surface than the electrode structure within the first region; or
- rounder edges than the electrode structure within the first region.

* * * * *